(12) United States Patent
Takahashi

(10) Patent No.: US 10,832,626 B2
(45) Date of Patent: *Nov. 10, 2020

(54) SEMICONDUCTOR DEVICE, DISPLAY DEVICE, AND ELECTRONIC DEVICE

(71) Applicant: Semiconductor Energy Laboratory Co., Ltd., Atsugi (JP)

(72) Inventor: Kei Takahashi, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/112,833

(22) Filed: Aug. 27, 2018

(65) Prior Publication Data

US 2019/0012979 A1    Jan. 10, 2019

Related U.S. Application Data

(63) Continuation of application No. 15/447,752, filed on Mar. 2, 2017, now Pat. No. 10,083,668.

(30) Foreign Application Priority Data

Mar. 9, 2016   (JP) .................................. 2016-045375

(51) Int. Cl.
   *H03M 1/66*   (2006.01)
   *G09G 3/36*   (2006.01)
   (Continued)

(52) U.S. Cl.
   CPC ........... *G09G 3/3688* (2013.01); *G06F 3/041* (2013.01); *G06F 3/044* (2013.01); *G06F 3/0416* (2013.01);
   (Continued)

(58) Field of Classification Search
   CPC ........... G09G 2310/027; G09G 3/3688; G09G 2310/0291; G09G 3/3291;
   (Continued)

(56) References Cited

U.S. PATENT DOCUMENTS 4,363,025 A    12/1982  Jackson
6,266,040 B1*  7/2001  Nagatomo ........... G09G 3/3611
                                                345/211

(Continued)

OTHER PUBLICATIONS

Jeon.Y et al., "A Piecewise-Linear 10b DAC Architecture with Drain-Current AMLCD Driver ICs", ISSCC 2009 (Digest of Technical Papers. IEEE International Solid-State Circuits Conference), Feb. 8, 2009, pp. 264-265, 265a.

(Continued)

*Primary Examiner* — Linh V Nguyen
(74) *Attorney, Agent, or Firm* — Fish & Richardson P.C.

(57) ABSTRACT

A semiconductor device in which variations are controlled is provided. The semiconductor device has a function of converting a digital signal into an analog signal, and includes a digital-analog converter circuit, an amplifier circuit, first to fourth switches, a first output terminal, a second output terminal, and a power source. The amplifier circuit is configured to perform feedback control when the first switch and the fourth switch are on and the second switch and the third switch are off. The amplifier circuit is configured to perform comparison control when the first switch and the fourth switch are off and the second switch and the third switch are on; utilizing this, variations in the digital-analog converter circuit and the amplifier circuit are controlled.

11 Claims, 25 Drawing Sheets

(51) Int. Cl.

| | | |
|---|---|---|
| *H03F 3/45* | (2006.01) | |
| *G06F 3/041* | (2006.01) | |
| *G06F 3/044* | (2006.01) | |
| *H01L 21/78* | (2006.01) | |
| *H03M 1/68* | (2006.01) | |
| *H03M 1/74* | (2006.01) | |
| *H03M 1/76* | (2006.01) | |
| *G11C 19/00* | (2006.01) | |

(52) U.S. Cl.
CPC .......... *G09G 3/3696* (2013.01); *H01L 21/78* (2013.01); *H03F 3/45475* (2013.01); *H03F 3/45968* (2013.01); *G09G 2310/027* (2013.01); *G09G 2310/0286* (2013.01); *G09G 2310/08* (2013.01); *G11C 19/00* (2013.01); *H03F 2200/421* (2013.01); *H03F 2203/45212* (2013.01); *H03M 1/66* (2013.01); *H03M 1/68* (2013.01); *H03M 1/742* (2013.01); *H03M 1/765* (2013.01)

(58) Field of Classification Search
CPC ......... G09G 2320/0295; G09G 3/3233; G09G 3/3685; G09G 2320/0233; G09G 3/3614; H03M 1/804; H03M 1/687; H03M 1/72; H03M 1/76; H03M 1/806; H03M 1/667; H03M 1/002; H03M 1/0607; H03M 1/662; H03M 1/58; H03M 1/66; H03M 1/68
USPC .............. 341/144–154; 345/76–82, 214
See application file for complete search history.

(56) References Cited

U.S. PATENT DOCUMENTS

| | | | |
|---|---|---|---|
| 8,462,145 B2 | 6/2013 | Kim et al. | |
| 8,742,964 B2 | 6/2014 | Kleks et al. | |
| 9,661,701 B2 * | 5/2017 | Huang | H05B 45/50 |
| 10,083,668 B2 * | 9/2018 | Takahashi | G06F 3/0416 |
| 10,083,688 B2 * | 9/2018 | Piernot | G10L 15/22 |
| 2002/0063304 A1 | 5/2002 | Toeda et al. | |
| 2003/0146909 A1 | 8/2003 | Maki | |
| 2005/0062508 A1 * | 3/2005 | Nishimura | H03K 17/04163 |
| | | | 327/112 |
| 2005/0140630 A1 | 6/2005 | Kikuchi et al. | |
| 2005/0168416 A1 * | 8/2005 | Hashimoto | G09G 3/3291 |
| | | | 345/76 |
| 2006/0279505 A1 | 12/2006 | Nagato et al. | |
| 2008/0100380 A1 * | 5/2008 | Nishimura | H03F 3/3022 |
| | | | 330/252 |
| 2009/0040212 A1 * | 2/2009 | Wang | G09G 3/2077 |
| | | | 345/214 |
| 2009/0174338 A1 | 7/2009 | Muramatsu | |
| 2010/0141493 A1 | 6/2010 | Cho et al. | |
| 2010/0156867 A1 | 6/2010 | Kim et al. | |
| 2010/0271364 A1 * | 10/2010 | Nishimura | G09G 3/3688 |
| | | | 345/214 |
| 2011/0141098 A1 | 6/2011 | Yaguma et al. | |
| 2011/0310080 A1 * | 12/2011 | Tonomura | G09G 3/3688 |
| | | | 345/211 |
| 2012/0206424 A1 | 8/2012 | Chen et al. | |
| 2012/0249607 A1 | 10/2012 | Ichikura et al. | |
| 2014/0267211 A1 | 9/2014 | Todorovich | |
| 2015/0141493 A1 | 5/2015 | Freier et al. | |
| 2015/0333714 A1 | 11/2015 | Chiu | |
| 2017/0053584 A1 * | 2/2017 | Takahashi | G09G 3/3283 |

OTHER PUBLICATIONS

Lee.S et al., "6.2: A 10 Bits Modified VCC Interpolation and DVO Correction by Drain Current Injection", SID Digest '10 : SID International Symposium Digest of Technical Papers, May 23, 2010, pp. 58-61.

\* cited by examiner

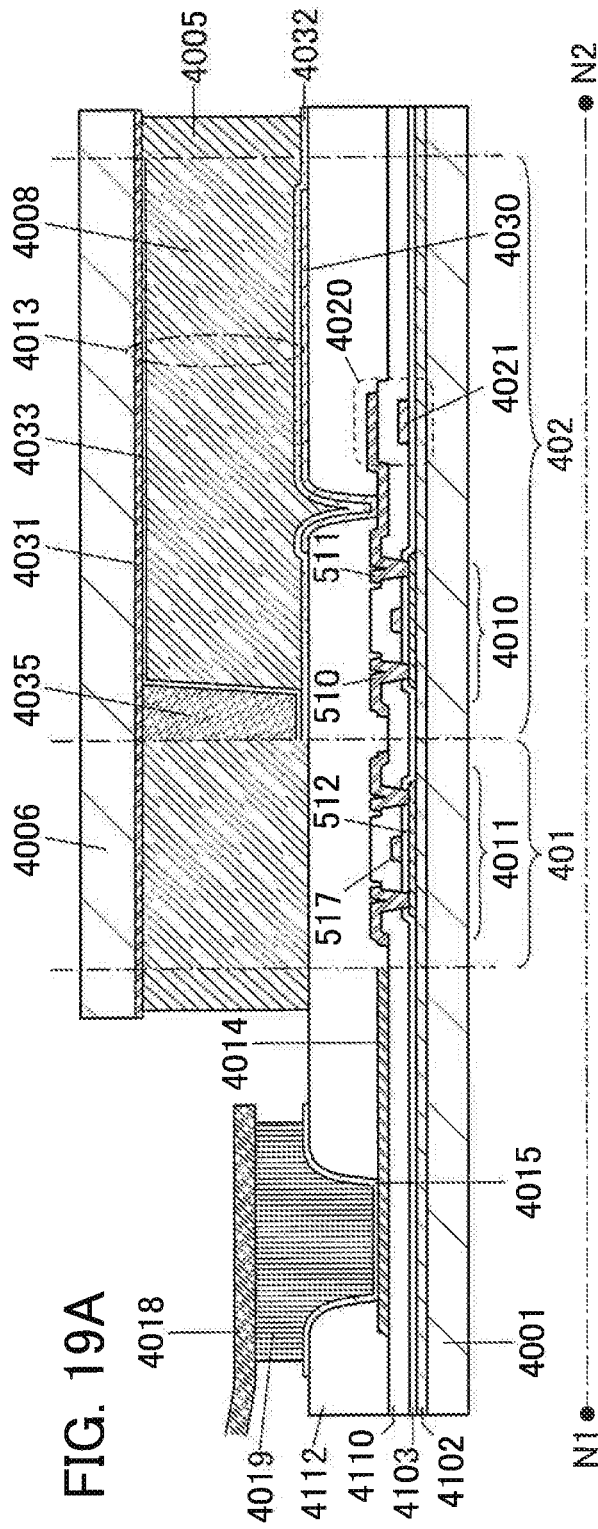
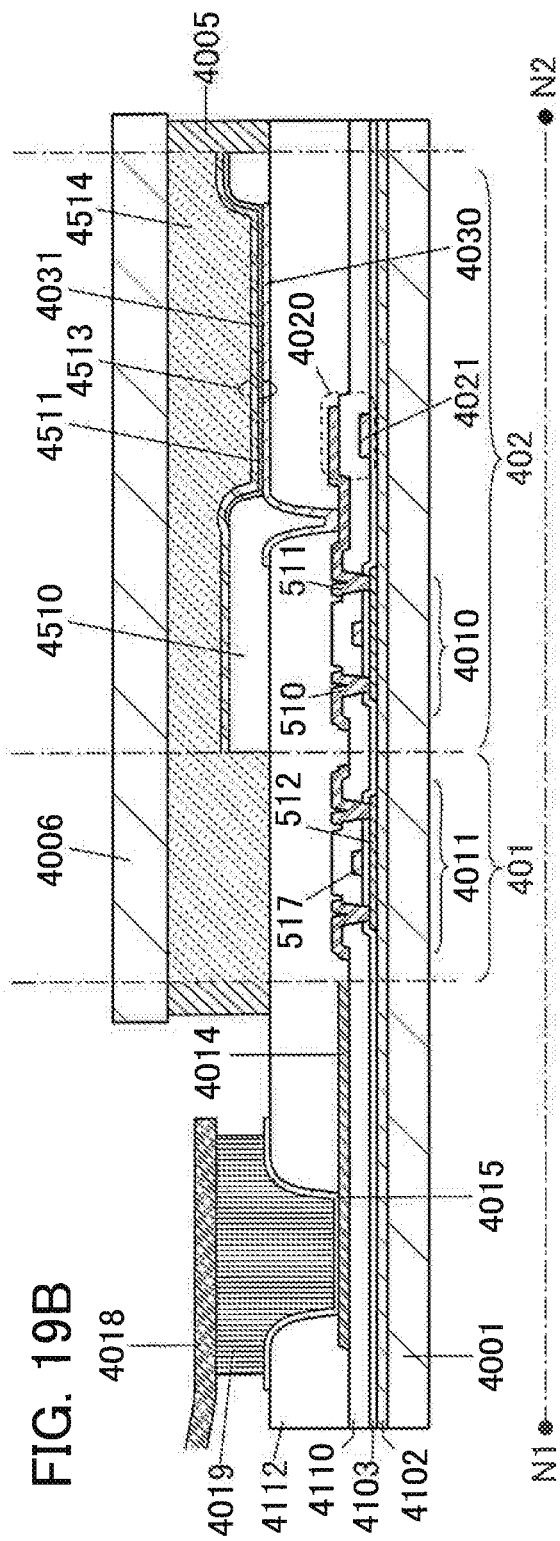
FIG. 19A
FIG. 19B

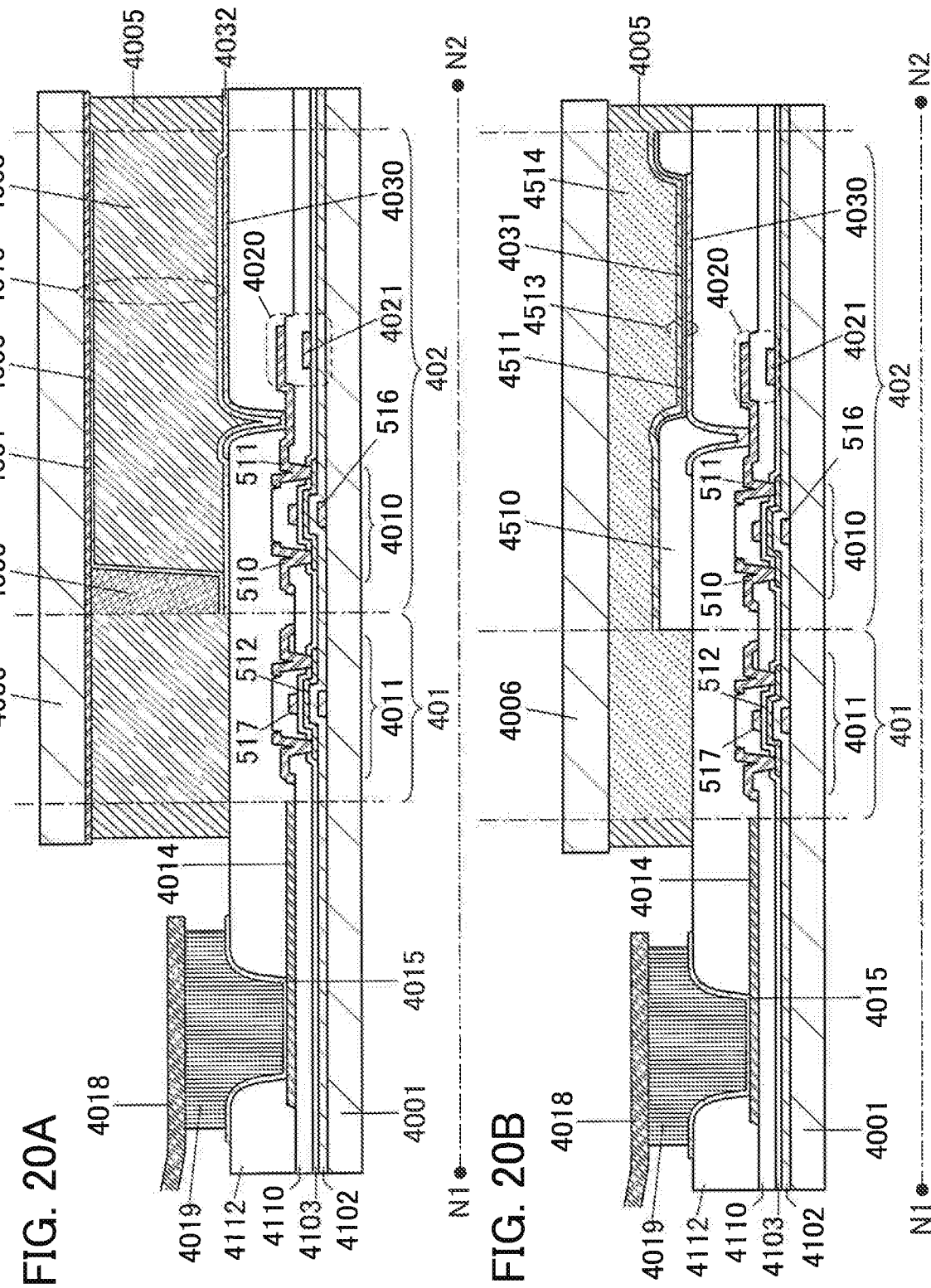

SEMICONDUCTOR DEVICE, DISPLAY DEVICE, AND ELECTRONIC DEVICE

CROSS-REFERENCE TO RELATED APPLICATIONS

This application is a continuation of U.S. application Ser. No. 15/447,752, filed Mar. 2, 2017, now allowed, which claims the benefit of a foreign priority application filed in Japan as Serial No. 2016-045375 on Mar. 9, 2016, both of which are incorporated by reference.

BACKGROUND OF THE INVENTION

1. Field of the Invention

One embodiment of the present invention relates to a semiconductor device, a display device, and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, a driving method thereof, and a manufacturing method thereof.

In this specification and the like, a semiconductor device means a device, a circuit, an element, and the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

There is a trend toward multiple gray levels of display data and higher resolution of display regions. To meet the demand for higher resolution, an integrated circuit (IC) is used as a driver circuit of a display device, particularly as a signal line driver circuit (also referred to as a source driver). The driver IC means a driver circuit in the form of an IC.

A driver IC includes a grayscale voltage generation circuit. This grayscale voltage generation circuit generates an analog signal to be supplied to a pixel from a digital signal which is an image data. The grayscale voltage generation circuit functions as what is called a digital-analog converter circuit (D/A converter circuit).

The driver IC includes an amplifier circuit for output, in addition to the D/A converter circuit. Here, a circuit including a D/A converter circuit and an amplifier circuit is referred to as a D/A converter module. The increase in the number of grayscale levels decreases the voltage width corresponding to one grayscale level.

The D/A converter module is required to convert a digital signal into an analog signal in a prescribed period in accordance with an increase in the number of pixels. Furthermore, the D/A converter module is required to be small in size in order to reduce the area of the driver IC.

In Non-Patent Document 1, a resistor-ladder D/A converter circuit is proposed.

In Patent Document 1, a D/A converter circuit which converts an upper-bit digital signal and a lower-bit digital signal into an analog signal using a combination of a resistor-ladder method and a current-control method is proposed.

REFERENCE

Patent Document

[Patent Document 1] United States Patent Application Publication No. 2015-0141493

Non-Patent Document

[Non-Patent Document 1] Lee. S et al., "A 10 Bits Modified VCC Interpolation and DVO Correction by Drain Current Injection", SID 2010 Digest: SID International Symposium Digest of Technical Papers, 2010, pp. 58-61.

SUMMARY OF THE INVENTION

A D/A converter circuit includes elements such as switches or resistors, and these elements have element variations and characteristic variations. The element variations and characteristic variations among the elements in the D/A converter circuit cause errors in converting a digital signal into an analog signal.

An amplifier circuit includes elements such as transistors, and these elements also have element variations and characteristic variations. In other words, an output signal from an amplifier circuit includes not only the errors due to the D/A converter circuit but also errors due to the element variations and characteristic variations among the elements included in the amplifier circuit. Thus, an analog signal output from the D/A converter module is largely different from an analog signal that is ideally obtained by conversion. When the error in the analog signal makes the output voltage to be changed by more than the voltage width corresponding to one grayscale level, a deviation in grayscale level or grayscale inversion is caused in pixels and an image cannot be favorably displayed.

The above-described element variations refer to variations due to variations in shape or composition. The characteristic variations refer to variations in characteristics such as the threshold voltage of a semiconductor element.

Furthermore, in a driver IC including a plurality of D/A converter modules, element variations and characteristic variations among the D/A converter modules cause variations in driving signals.

Alternatively, in a display device including a plurality of driver ICs, variations are generated among analog signals output from the driver ICs.

In a driver IC or the like, a signal-to-noise ratio (SNR) is degraded when an environmental variable such as temperature changes.

In view of the foregoing problems, an object of one embodiment of the present invention is to provide a semiconductor device having a novel structure, a display device having a novel structure, an electronic device having a novel structure, or the like. Another object of one embodiment of the present invention is to provide a semiconductor device having a novel structure, a display device having a novel structure, an electronic device having a novel structure, or the like from which an accurate analog signal can be obtained by suppression of element variations and variations due to an influence of an environmental variable such as temperature in transistors or the like used in the semiconductor device, the display device, the electronic device, or the like.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device which includes a digital-analog converter circuit, an amplifier circuit, a first switch, a second switch, a third switch, a fourth switch, a first output terminal, a second output terminal, and a first input terminal. In the semiconductor device, an output terminal of the digital-analog converter circuit is electrically connected to a non-inverting input terminal of the amplifier circuit. One terminal of the first switch is electrically connected to an inverting input terminal of the amplifier circuit. The other terminal of the first switch is electrically connected to an output terminal of the amplifier circuit. One terminal of the second switch is electrically connected to the inverting input terminal of the amplifier circuit. The other terminal of the second switch is electrically connected to the first input terminal. One terminal of the third switch is electrically connected to the output terminal of the amplifier circuit. The other terminal of the third switch is electrically connected to the second output terminal. One terminal of the fourth switch is electrically connected to the output terminal of the amplifier circuit. The other terminal of the fourth switch is electrically connected to the first output terminal. The amplifier circuit is configured to perform feedback control when the first switch and the fourth switch are on and the second switch and the third switch are off. The amplifier circuit is configured to perform comparison control when the first switch and the fourth switch are off and the second switch and the third switch are on.

One embodiment of the present invention is a semiconductor device which includes a digital-analog converter circuit, an amplifier circuit, a first switch, a second switch, a third switch, a fourth switch, a fifth switch, a first output terminal, a second output terminal, a first input terminal, and a second input terminal. In the semiconductor device, an output terminal of the digital-analog converter circuit is electrically connected to a non-inverting input terminal of the amplifier circuit. One terminal of the first switch is electrically connected to an inverting input terminal of the amplifier circuit. The other terminal of the first switch is electrically connected to an output terminal of the amplifier circuit. One terminal of the second switch is electrically connected to the inverting input terminal of the amplifier circuit. The other terminal of the second switch is electrically connected to the first input terminal. One terminal of the third switch is electrically connected to the output terminal of the amplifier circuit. The other terminal of the third switch is electrically connected to the second output terminal. One terminal of the fourth switch is electrically connected to the output terminal of the amplifier circuit. The other terminal of the fourth switch is electrically connected to the first output terminal. One terminal of the fifth switch is electrically connected to the first output terminal. The other terminal of the fifth switch is electrically connected to the second input terminal. The amplifier circuit is configured to perform feedback control when the first switch and the fourth switch are on and the second switch, the third switch, and the fifth switch are off. The amplifier circuit is configured to perform comparison control when the first switch and the fourth switch are off and the second switch, the third switch, and the fifth switch are on. An input from the second input terminal is output to the first output terminal when the second switch, the third switch, and the fifth switch are on.

One embodiment of the present invention provides a semiconductor device having a novel structure, a display device having a novel structure, an electronic device having a novel structure, or the like. Furthermore, one embodiment of the present invention provides a semiconductor device having a novel structure, a display device having a novel structure, an electronic device having a novel structure, or the like from which an accurate analog signal can be obtained by suppression of element variations and variations due to an influence of an environmental variable such as temperature in transistors or the like used in the semiconductor device, the display device, the electronic device, or the like.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIGS. 19A and 19B are cross-sectional views each illustrating a structure example of a display panel;

FIGS. 20A and 20B are cross-sectional views each illustrating a structure example of a display panel;

DETAILED DESCRIPTION OF THE INVENTION

Figure 1:
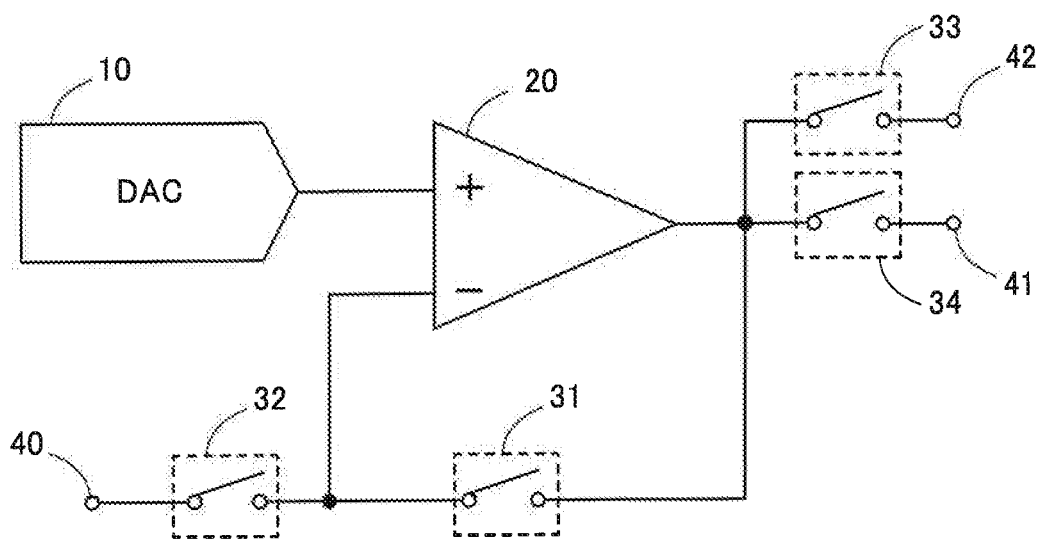
FIG. 1 is a circuit diagram of a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the channel region between the source region and the drain region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal 1" to may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

Embodiment 1

In this embodiment, a semiconductor device in which variations are controlled will be described with reference to FIG. 1, FIG. 2, FIG. 3, FIGS. 4A and 4B, FIG. 5, and FIGS. 6A and 6B. The semiconductor device described in this embodiment has a function of converting a digital signal into an analog signal and converting the analog signal into a signal having low output impedance by an amplifier circuit.

FIG. 1 is a block diagram illustrating a structure of the semiconductor device. A semiconductor device 100 includes a digital-analog converter circuit (D/A converter circuit) 10, an amplifier circuit 20, a first switch 31, a second switch 32, a third switch 33, a fourth switch 34, a first input terminal 40, a first output terminal 41, and a second output terminal 42.

The semiconductor device 100 has a function of changing connections of the amplifier circuit 20 by turning on or off the first switch 31, the second switch 32, the third switch 33, and the fourth switch 34. Table 1 shows switching conditions in MODE 1 and MODE 2.

TABLE 1

|  | MODE 1 | MODE 2 |
|---|---|---|
| SW 31 | ON | OFF |
| SW 32 | OFF | ON |
| SW 33 | OFF | ON |
| SW 34 | ON | OFF |

In MODE 1 which is shown in Table 1, the first switch 31 and the fourth switch 34 are on, and the second switch 32 and the third switch 33 are off. In this mode, the amplifier circuit 20 has a function of performing feedback control. In other words, the amplifier circuit 20 functions as a voltage follower circuit in MODE 1.

The semiconductor device 100 converts a digital signal ($D_{DAC}$) into an analog signal ($V_{DAC}$) by the D/A converter circuit 10 and outputs a signal having low impedance to the first output terminal 41 by the voltage follower circuit. An arbitrary data value A is expressed as $D_{DAC}$[A] when it is a digital signal and as $V_{DAC}$[A] when it is an analog signal.

In MODE 2 which is shown in Table 2, the first switch 31 and the fourth switch 34 are off, and the second switch 32 and the third switch 33 are on. In this mode, the amplifier circuit 20 has a function of performing comparison control. In other words, the amplifier circuit 20 functions as a comparator circuit in MODE 2.

An inverting input terminal of the amplifier circuit 20 functioning as a comparator circuit is supplied with a voltage from the first input terminal 40 through the second switch 32. The voltage supplied to the inverting input terminal is a reference voltage ($V_{REF}$). $V_{REF}$ may be a fixed voltage or a variable voltage set by a user. A non-inverting input terminal of the amplifier circuit 20 functioning as a comparator circuit is supplied with $V_{DAC}$. Note that $V_{REF}$ which represents an analog signal is expressed as $D_{REF}$ when it is a digital signal.

A result of comparison between $V_{REF}$ and $V_{DAC}$ supplied to the inverting input terminal and the non-inverting input terminal of the amplifier circuit 20 functioning as a comparator circuit is output from an output terminal of the amplifier circuit 20 through the third switch 33 to the second output terminal 42. An output signal supplied to the second output terminal 42 is referred to as a monitor signal (MONI). High or Low (in the drawing, H, L) is output as MONI.

In the amplifier circuit 20 functioning as a comparator circuit, $V_{REF}$ supplied to the inverting input terminal and $V_{DAC}$ supplied to the non-inverting input terminal are compared. When $V_{DAC}$>$V_{REF}$, the amplifier circuit 20 functioning as a comparator circuit outputs High to the second output terminal 42 through the third switch 33. When $V_{REF}$>$V_{DAC}$, the amplifier circuit 20 outputs Low to the second output terminal 42 through the third switch 33. For simple explanation, the output of the amplifier circuit 20 functioning as a comparator circuit in MODE 2 is referred to as MONI.

A control signal TM for switching control is described. The second switch 32 and the third switch 33 are controlled with a control signal TM. The first switch 31 and the fourth switch 34 are controlled with a control signal TMB. The control signal TMB may be produced by inverting the control signal TM with an inverter circuit 36.

Figure 4A:
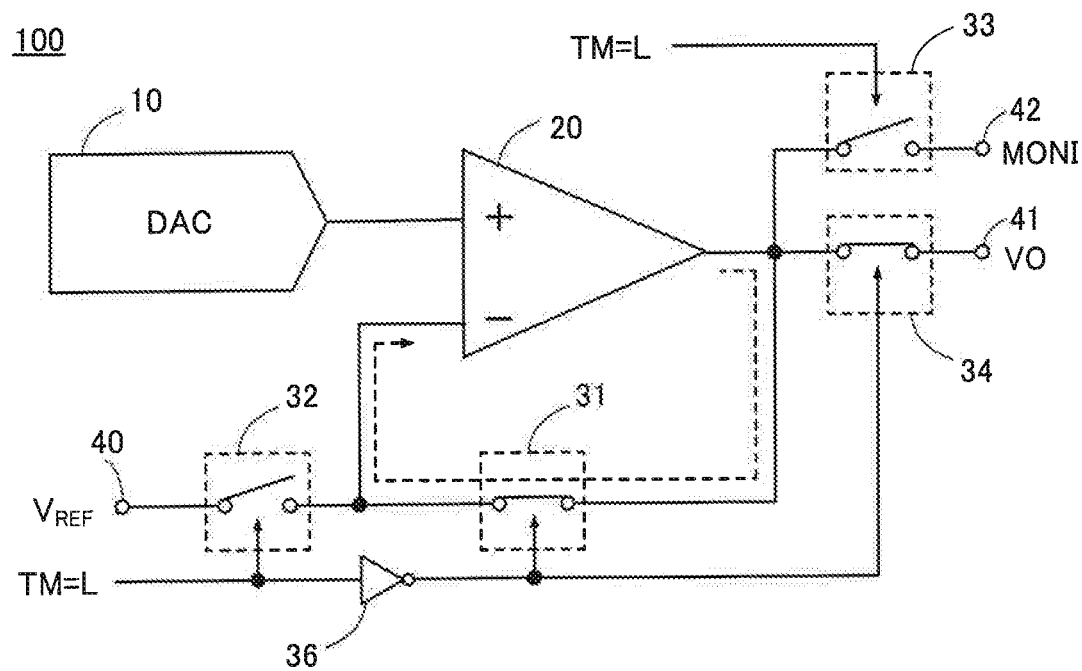
FIGS. 4A and 4B are each a circuit diagram of a semiconductor device.

In FIG. 4A, the amplifier circuit 20 in the semiconductor device 100 in FIG. 1 operates as a voltage follower circuit. In MODE 1 shown in Table 1, the control signal TM is set to be Low, so that the first switch 31 and the fourth switch 34 are on and the second switch 32 and the third switch 33 are off. In the following description, the switches 31 to 34 are assumed as n-channel transistors.

Figure 4B:
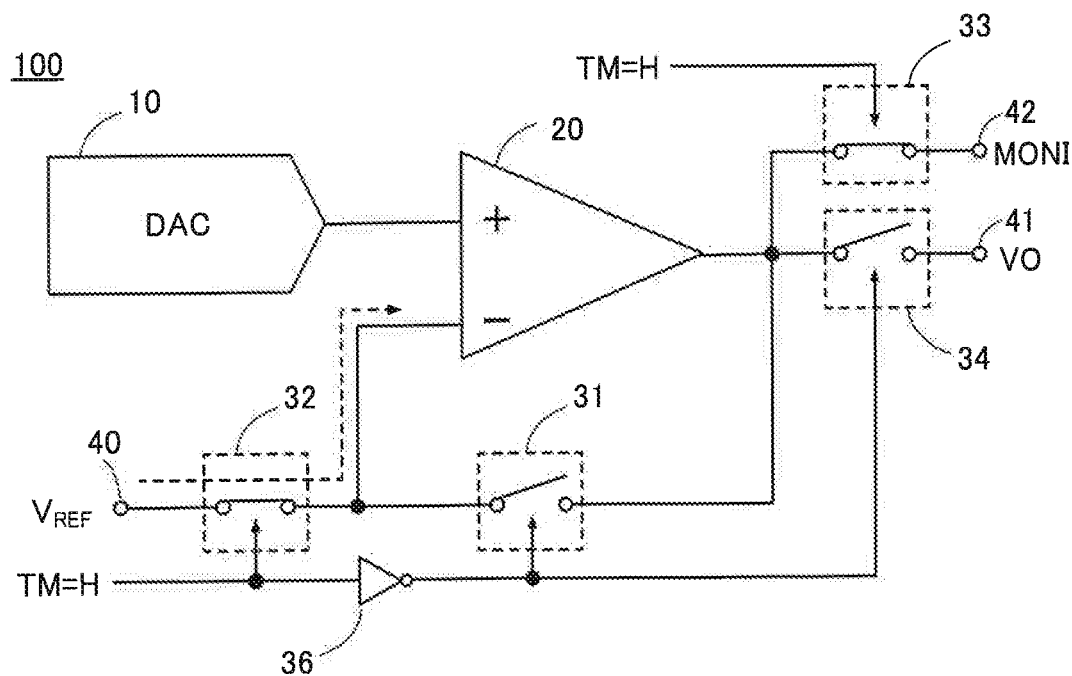

In FIG. 4B, the amplifier circuit 20 in the semiconductor device 100 in FIG. 1 operates as a comparator circuit. In MODE 2 shown in Table 1, the control signal TM is set to be High, so that the first switch 31 and the fourth switch 34 are off and the second switch 32 and the third switch 33 are on.

FIGS. 4A and 4B show operations of the switches. As another example, the inverter circuit 36 may be omitted by using n-channel transistors as the first switch 31 and the fourth switch 34 and using p-channel transistors as the second switch 32 and the third switch 33. Alternatively, p-channel transistors may be used as the switches 31 to 34, in which case the control signal TM is set to have an opposite polarity.

Figure 2:
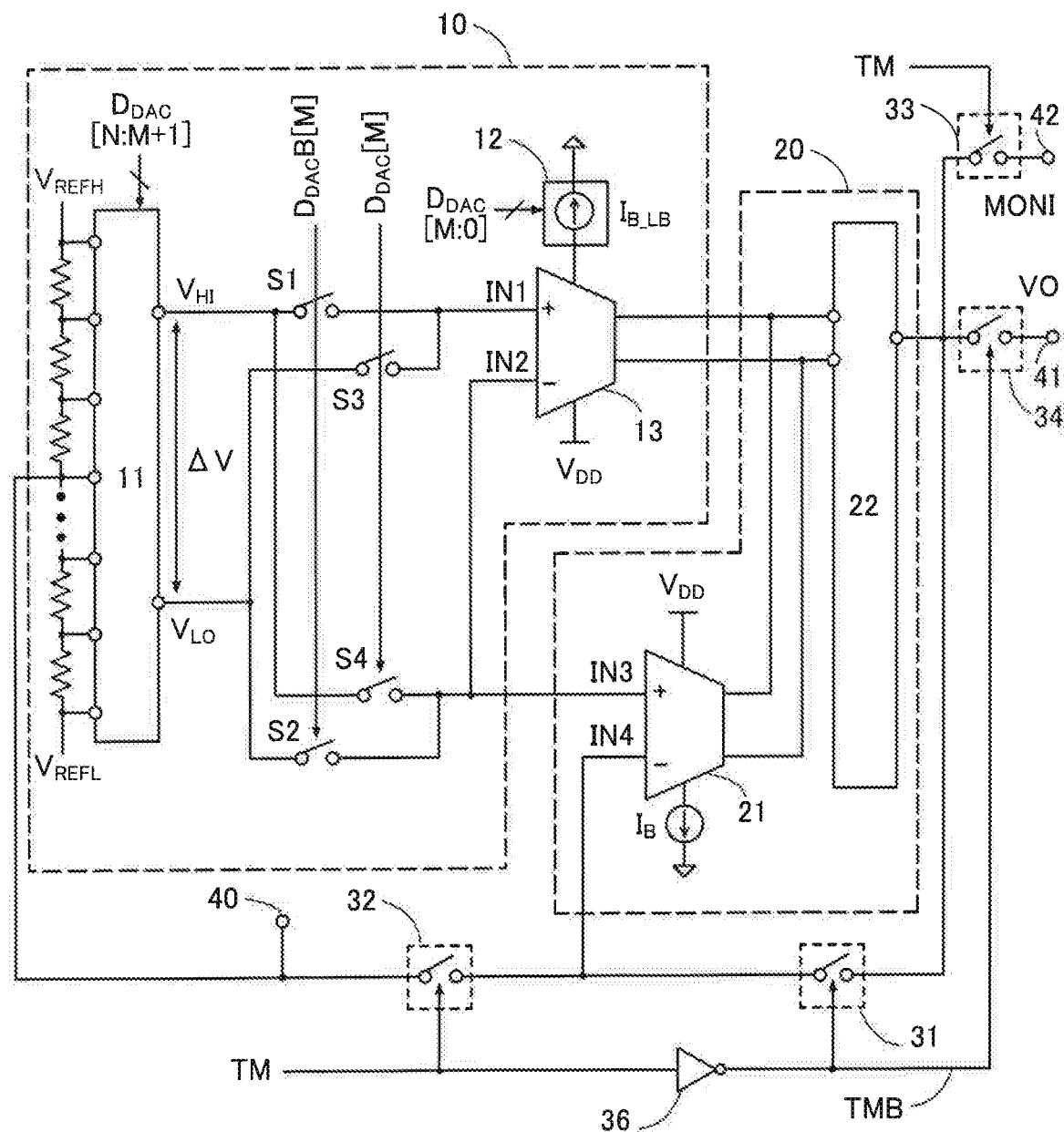
FIG. 2 is a circuit diagram illustrating a structure example of a semiconductor device.

A semiconductor device 101 illustrated in FIG. 2 is an example of the embodiment in FIG. 1. The semiconductor device 101 includes the D/A converter circuit 10, the amplifier circuit 20, the first switch 31, the second switch 32, the third switch 33, the fourth switch 34, the inverter circuit 36, the input terminal 40, the first output terminal 41, and the second output terminal 42.

The D/A converter circuit 10 has an N-bit data width. The D/A converter circuit 10 includes a resistor-ladder D/A converter circuit (R-DAC 11) which generates higher-order bits [N:M+1] of a grayscale voltage, a current control circuit 12 which generates lower-order bits [M:0] of the grayscale voltage, an amplifier circuit 13, and switches S1, S2, S3, and S4 which switch inputs of lower-bits [M:0]. M is an integer of 1 or more, and N is an integer of more than M+1.

The amplifier circuit 20 includes an amplifier circuit 21 and an output buffer 22.

An inverting input terminal of the amplifier circuit 21 is electrically connected to any of dividing points of serially connected resistors in the R-DAC 11 through the second switch 32.

The control signal TM is a signal for changing connections between MODE 1 and MODE 2. A wiring to which the control signal TM is supplied is connected to the second switch 32 and the third switch 33. The control signal TM is supplied to the first switch 31 and the fourth switch 34 through the inverter circuit 36. In a period when the control signal TM is Low, MODE 1 is selected and the amplifier circuit 20 operates as a voltage follower circuit. In a period when the control signal TM is High, MODE 2 is selected and the amplifier circuit 20 operates as a comparator circuit.

Figure 3:
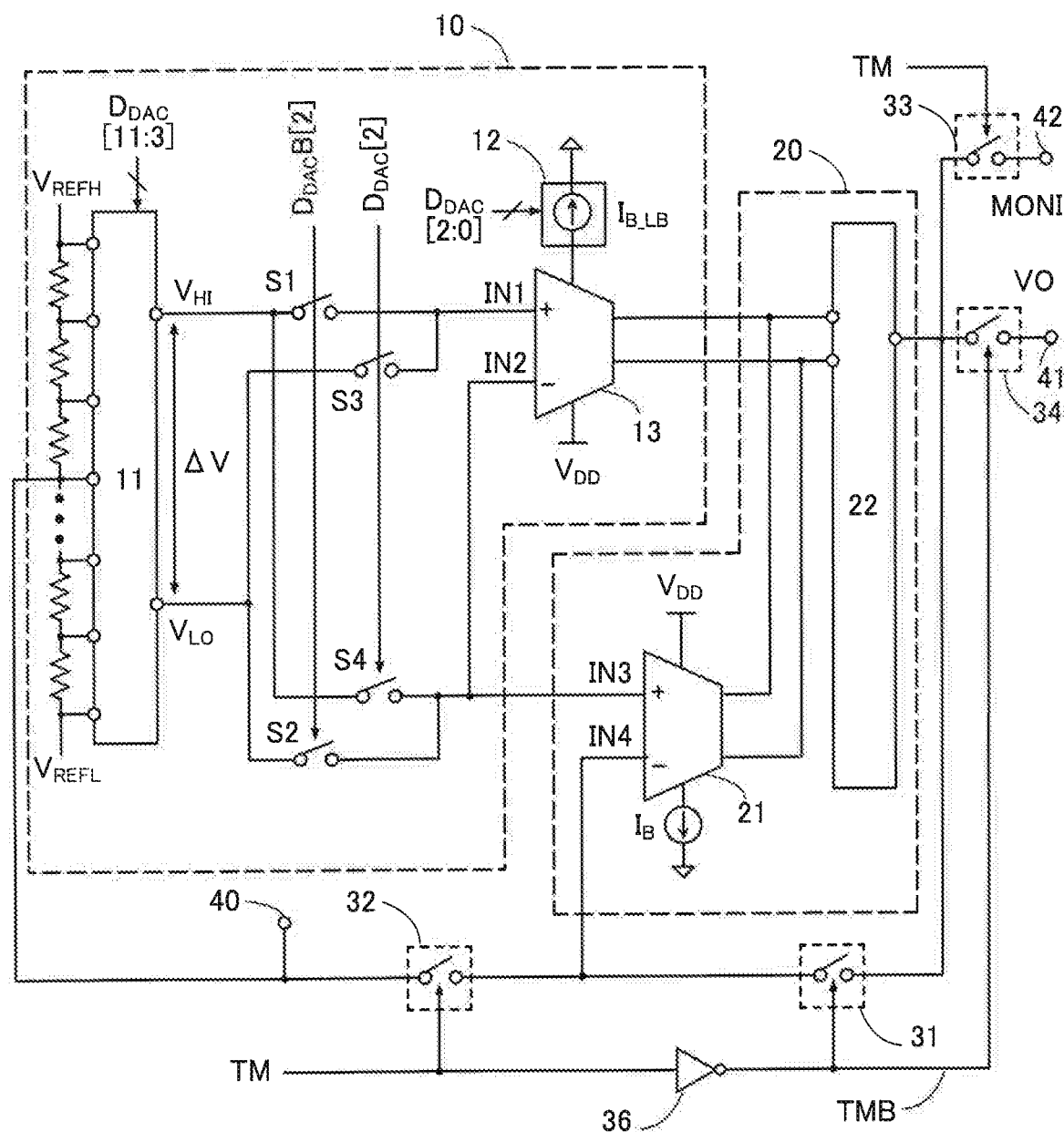
FIG. 3 is a circuit diagram illustrating a structure example of a semiconductor device.

FIG. 3 illustrates an example of the semiconductor device 101 in which the embodiment in FIG. 2 is applied to the 12-bit ($D_{DAC}$[11:0]) D/A converter circuit 10.

The R-DAC 11 in the D/A converter circuit 10 is supplied with $V_{REFH}$ and $V_{REFL}$ as reference voltages and generates $V_{HI}$ and $V_{LO}$ by resistance division. $V_{HI}$ and $V_{LO}$ are generated by higher 9 bits of $D_{DAC}$ [11:0].

The resolution of the 9-bit (512-grayscale-level) R-DAC 11 is described below.

Equation (1) expresses ΔV which represents the difference between $V_{HI}$ and $V_{LO}$. $V_{HI}$ of an arbitrary data value A is expressed by Equation (2), and $V_{LO}$ thereof is expressed by Equation (3).

$$\Delta V = V_{HI} - V_{LO} = (V_{REFH} - V_{REFL})/512 \quad (1)$$

$$V_{HI} = V_{DAC}[A] \quad (2)$$

$$V_{LO} = V_{DAC}[A] - \Delta V \quad (3)$$

A method for generating lower-order bits of a grayscale voltage is described below. Lower 3 bits of $D_{DAC}$ [11:0] are supplied to the current control circuit 12, and a current corresponding to the lower 3 bits of the grayscale voltage is generated by current control. The amplifier circuit 13 and the switches S1, S2, S3, and S4 have a function of converting a current into a voltage.

In the semiconductor device 100 in FIG. 4B, the D/A converter circuit 10 and the amplifier circuit 20 have element variations in shape, composition, or the like, characteristic variations in the threshold voltage or the like of transistors, or the like. For example, when a digital signal is converted into an analog signal, a conversion error arises owing to variations in resistance or the like in the R-DAC 11, variations in characteristics or the like of transistors in the amplifier circuit, or the like. A grayscale voltage including the conversion error is output from the semiconductor device 100. A difference between an ideal voltage value and the output value including variations or the like is referred to as an offset amount. The offset amount is denoted as $V_{OFF}$ in analog signal, and $D_{OFF}$ in digital signal.

Figure 5:
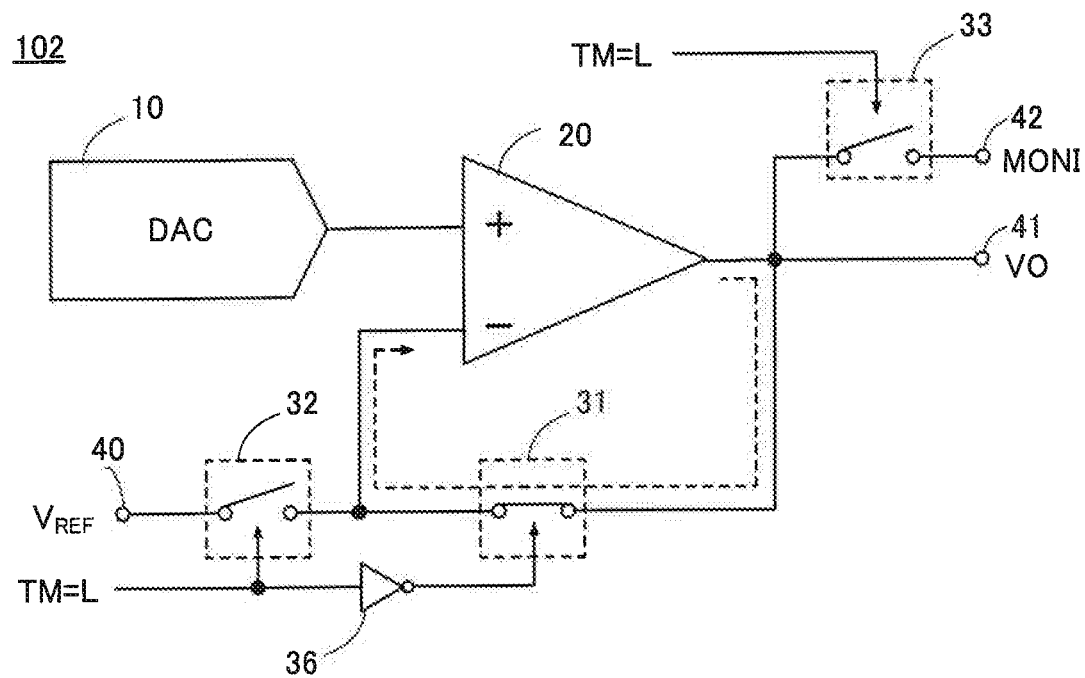
FIG. 5 is a circuit diagram of a semiconductor device.

A semiconductor device 102 in FIG. 5 is a circuit different from the semiconductor device 100 illustrated in FIGS. 4A and 4B. The semiconductor device 102 in FIG. 5 is different from the semiconductor device 100 in FIGS. 4A and 4B in not including the switch 34.

In the circuit illustrated in FIG. 5, the output of the amplifier circuit 20 is connected to the first output terminal 41. The amplifier circuit 20 can have lower output impedance.

Figure 6A:
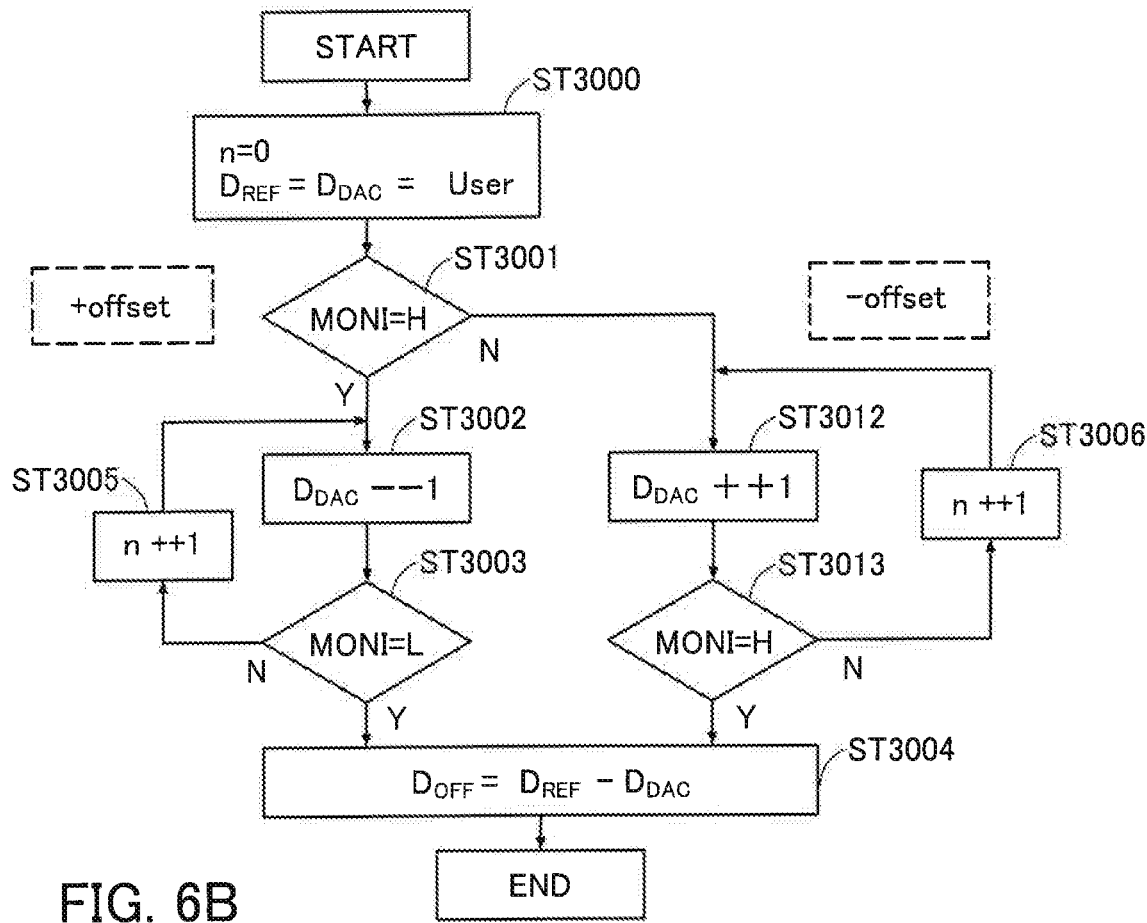
FIG. 6A is a flow chart, and FIG. 6B schematically shows a determination process.

FIG. 6A is a flow chart for detecting $V_{OFF}$ which is generated owing to variations in the D/A converter circuit 10 and the amplifier circuit 20 in the semiconductor device 100 in FIG. 4B. To detect $V_{OFF}$, the conditions of MODE 2 are made by setting the control signal TM to be High, so that the amplifier circuit 20 is made to operate as a comparator circuit. Although the comparator circuit performs comparison using the analog signal ($V_{DAC}$), in the following process flow, the D/A converter circuit 10 performs a process using a digital signal ($D_{DAC}$). A least significant bit (LSB) is the smallest unit of a digital signal.

At START in FIG. 6A, the control signal TM in FIG. 4B is set to be High so that MODE 2 is selected. In a period in MODE 2, the first switch 31 and the fourth switch 34 are off and the second switch 32 and the third switch 33 are on. A reference voltage $V_{REF}$ is supplied to the first input terminal 40, and then supplied to the inverting input terminal through the second switch 32.

In a first step ST3000, $D_{DAC}$ is supplied to the D/A converter circuit 10 so that the same voltage value as $V_{REF}$ is input to the non-inverting input terminal of the amplifier circuit 20 functioning as a comparator circuit.

Note that n is a parameter used in the flow chart, showing the count number of a loop counter which counts the number of processes. An initial value of n is 0.

In a second step ST3001, the reference voltage $V_{REF}$ supplied to the inverting input terminal of the amplifier circuit 20 functioning as a comparator circuit and $V_{DAC}$ supplied to the non-inverting input terminal are compared. The comparison result from the amplifier circuit 20 functioning as a comparator circuit is output as MONI through the third switch 33, and whether MONI is H or L is determined. Depending on the output result of MONI, the process goes to either of the following, the offset detection to the positive side (positive offset detection) and the offset detection to the negative side (negative offset detection).

First, the positive offset process is described. When MONI=H, $V_{OFF}$ is a positive value.

In a third step ST 3002, the digital signal $D_{DAC}$ supplied to the D/A converter circuit 10 is decremented by one LSB.

In a fourth step ST3003, $V_{REF}$ and $V_{DAC}$ are compared again by the comparator circuit. When the comparison result that MONI=H is obtained, n is incremented in ST3005, and the process goes to ST3002.

In a fifth step ST3004, because of the detection of MONI=L in the step ST3003, it is judged that the output is reversed and the potential difference between $V_{REF}$ and $V_{DAC}$ becomes less than or equal to one LSB. Furthermore, $V_{OFF}$ which is detected by the amplifier circuit 20 functioning as a comparator circuit is calculated as a digital signal by Equation (4).

$$D_{OFF}=D_{REF}-D_{DAC} \quad (4)$$

Next, the negative offset detection is described. When MONI=L, $V_{OFF}$ is a negative value.

In a sixth step ST3012, $D_{DAC}$ supplied to the D/A converter circuit 10 is incremented by one LSB.

In a seventh step ST3013, $V_{REF}$ and $V_{DAC}$ are compared again by the amplifier circuit 20 functioning as a comparator circuit. When the comparison result that MONI=L is obtained, n is incremented in ST3006, and the process goes to ST3012.

In an eighth step ST3004, because of the detection of MONI=H in the step ST3013, it is judged that the output is reversed and the potential difference between $V_{REF}$ and $V_{DAC}$ becomes less than or equal to one LSB. Furthermore, $V_{OFF}$ which is detected by the amplifier circuit 20 functioning as a comparator circuit is calculated as a digital signal by Equation (4).

Figure 6B:
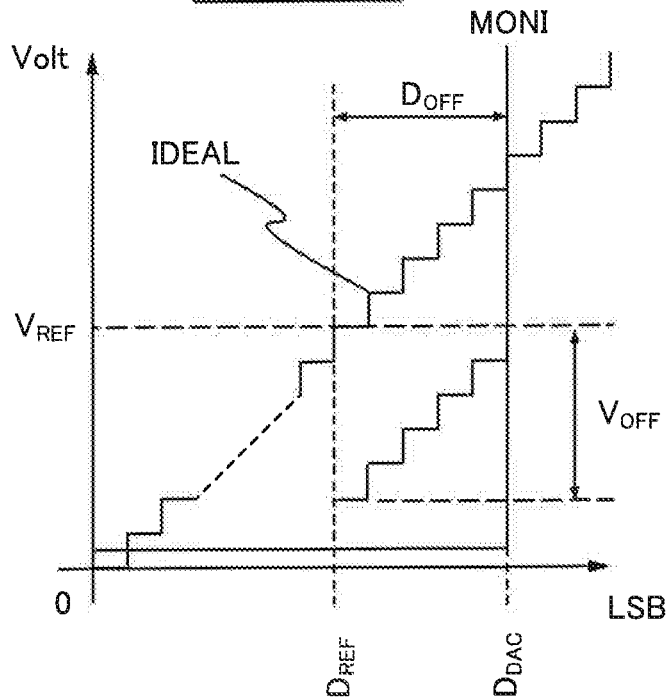

FIG. 6B shows an example of the offset detection process of FIG. 6A. A $V_{DAC}$ conversion error arises and an offset voltage is generated. When the negative offset process in FIG. 6A is executed and $D_{DAC}$ is incremented five times, MONI=H is detected. $D_{OFF}$ is calculated by Equation (5).

$$D_{OFF}=D_{REF}-D_{DAC}=D_{REF}-(D_{REF}+n) \quad (5)$$

From the above-described sequence, the conversion error $D_{OFF}$ being −5 LSB can be detected. In the conversion error, an error due to variations in the D/A converter circuit 10 and the amplifier circuit 20 functioning as a comparator circuit is contained. By correcting the conversion error $D_{OFF}$ of $D_{DAC}$ by an arithmetic process, a high-quality image with a suppressed influence of variations can be obtained.

A method for correcting the conversion error $V_{OFF}$ by the D/A converter circuit R-DAC 11 is described. The correction range is applied to the resolution of the R-DAC 11.

A maximum output voltage and a minimum output voltage of the analog signal of the R-DAC 11 illustrated in FIG. 2 are referred to as $V_{REFH}$ and $V_{REFL}$, respectively. The resolution of the 9-bit (512-grayscale-level) R-DAC 11 is produced by dividing the potential difference between $V_{REFH}$ and $V_{REFL}$ by resistors.

For example, when $V_{OFF}>0$, the voltage $V_{REFL}$ is corrected by adding $V_{OFF}$ to $V_{REFL}$.

For example, when $V_{OFF}<0$, the voltage $V_{REFH}$ is corrected by subtracting $V_{OFF}$ from $V_{REFH}$.

By correcting $V_{REFH}$ or $V_{REFL}$ of the R-DAC 11 by utilizing $V_{OFF}$, $V_{OFF}$ is also evenly divided by resistance division between $V_{REFH}$ and $V_{REFL}$. Furthermore, the digital signal of the lower bits is subjected to an arithmetic process, so that $V_{OFF}$ is corrected. By separately correcting the higher bits and the lower bits in the R-DAC 11 having a large resolution of the D/A converter circuit 10 and the current control circuit 12 having a small resolution respectively, correction with a suppressed influence of the amplifier circuit can be achieved. Even when the cause of the variations differs (e.g., resistors, transistors), a high-quality image with a suppressed influence of variations can be obtained.

The structures and method described in this embodiment can be implemented by being combined as appropriate with any of the other structures and methods described in the other embodiments.

Embodiment 2

In this embodiment, a semiconductor device in which variations are controlled is described with reference to FIG. 7 and FIG. 8.

In the semiconductor device 100 in FIG. 4A, the D/A converter circuit 10 and the amplifier circuit 20 have element variations in shape, composition, or the like, characteristic variations in the threshold voltage or the like of transistors, or the like. Moreover, the variations or the like can be increased by the influence of temperature, or other conditions, or the like. For example, when the temperature largely changes, $V_{OFF}$, which is a conversion error, also changes largely with the temperature.

Figure 7:
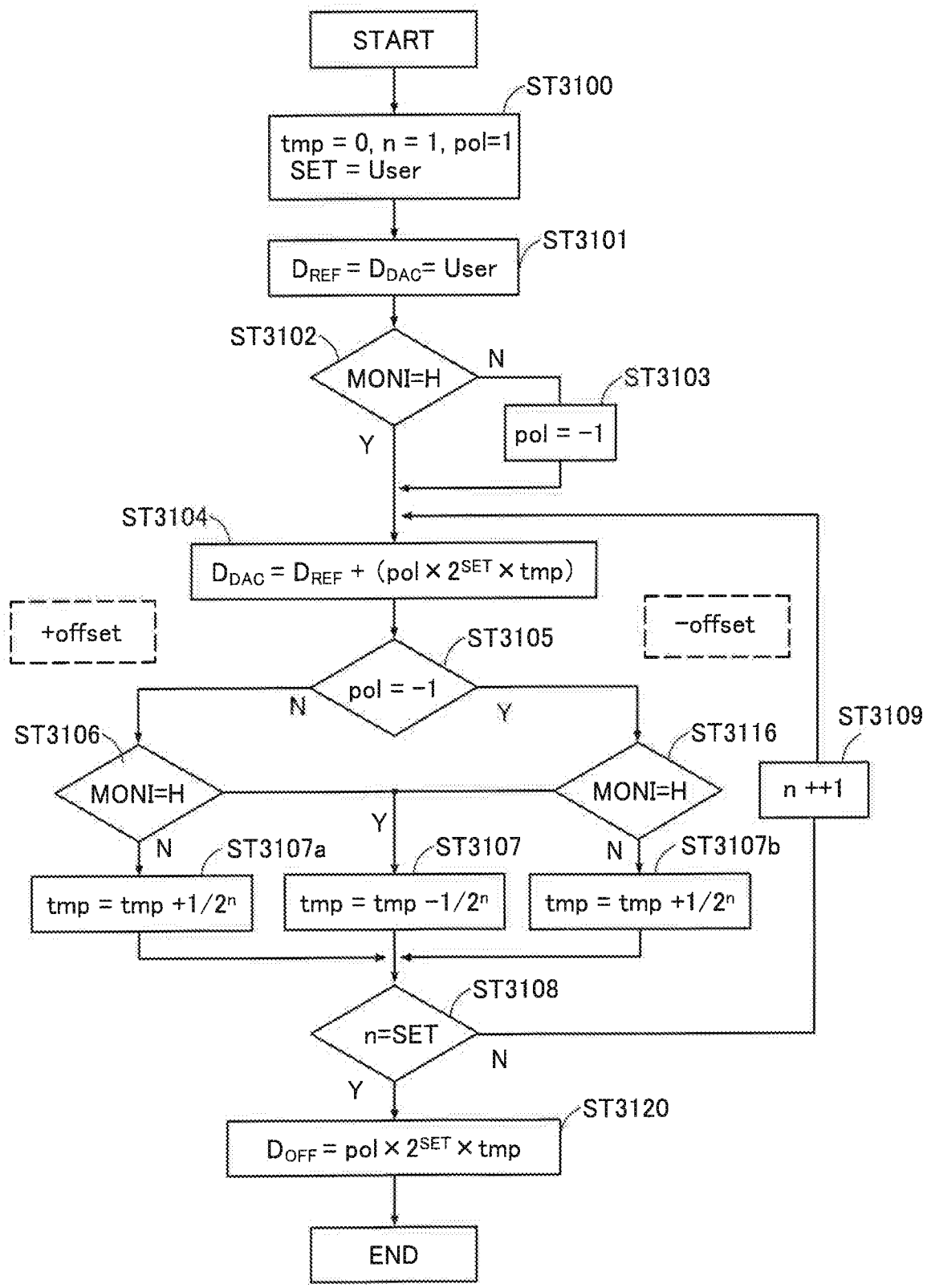
FIG. 7 is a flow chart.
Figure 8:
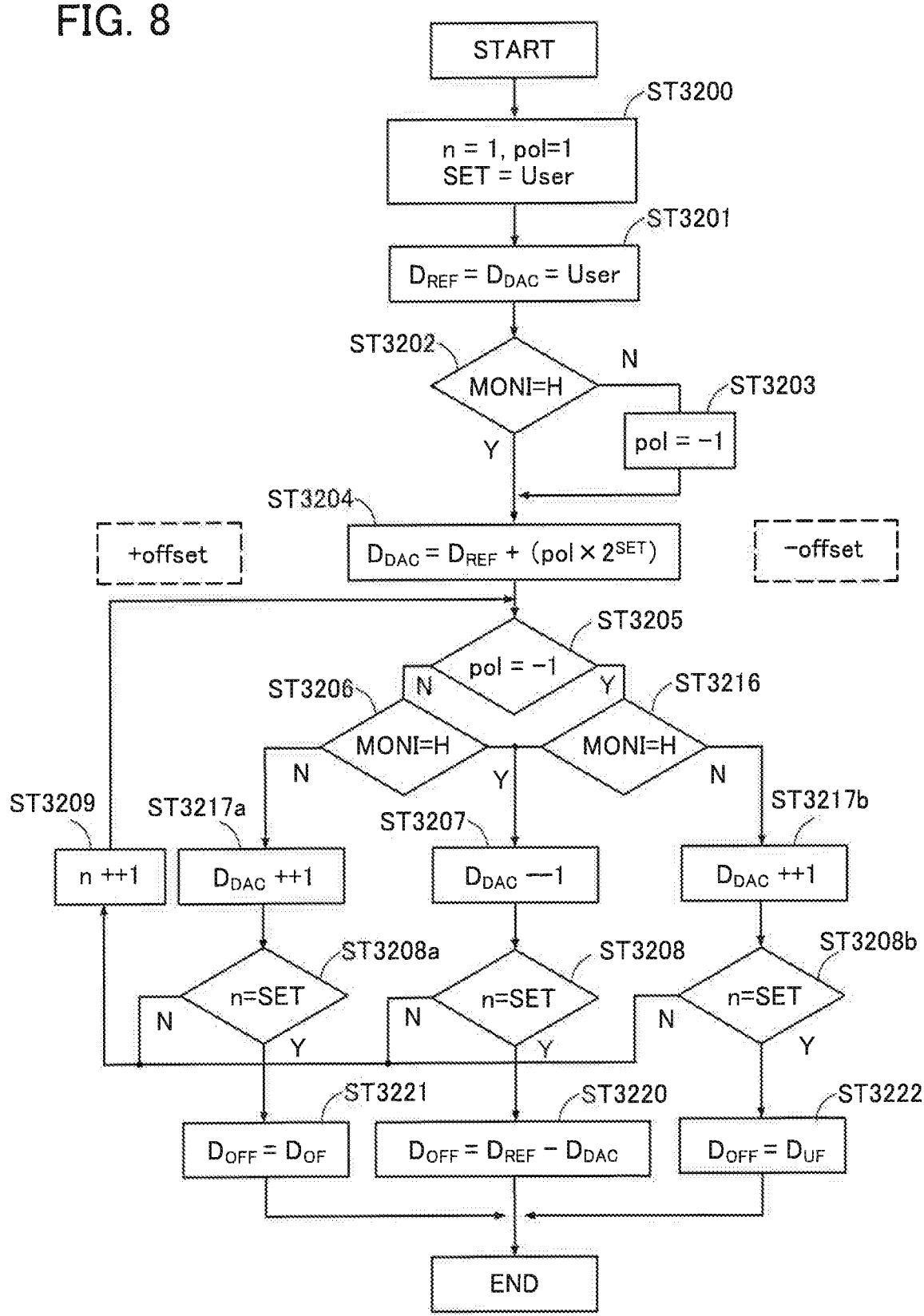
FIG. 8 is a flow chart.

FIG. 7 and FIG. 8 each show a method for detecting $V_{OFF}$, which is a conversion error, in a uniform process time as long as $V_{OFF}$ is within a range designated as a detection range.

A parameter which designates the detection range of $D_{OFF}$ in FIG. 7 or FIG. 8 is SET (a positive integer). The detection range designated by SET is from $+2^{SET}+SET$ to $-2^{SET}-SET$. In FIG. 7, the target detection range is from $+2^{SET}$ to $-2^{SET}$. In FIG. 8, detection in the range of from $+2^{SET}$ to $+SET$ and the range of from $-2^{SET}$ to $-SET$ is possible.

FIG. 7 and FIG. 8 are each a flow chart for detecting $V_{OFF}$. Parameters used in the flow charts are n which is the count number of a loop counter which counts the number of processes, pol which is a variable showing the polarity of $V_{OFF}$ (whether the polarity is positive or negative), and tmp which is a variable for temporarily storing an arithmetic result.

The inverting input terminal of the amplifier circuit 20 functioning as a comparator circuit is supplied with $V_{REF}$ as a reference voltage, and the non-inverting input terminal of the amplifier circuit 20 functioning as a comparator circuit is supplied with $V_{DAC}$. $V_{REF}$ may be a fixed voltage or a variable voltage set by a user.

FIG. 7 is a flow chart of a detection method within a detection range. In order to detect $V_{OFF}$ which is generated owing to variations in the D/A converter circuit 10 and the amplifier circuit 20 in the semiconductor device 100 in FIG. 4B, conditions of MODE 2 are selected, so that the amplifier circuit 20 operates as a comparator circuit.

At START in FIG. 7, MODE 2 is selected by setting High data as the control signal TM in FIG. 4B. In a period in MODE 2, the first switch 31 and the fourth switch 34 are off and the second switch 32 and the third switch 33 are on. $V_{REF}$ is supplied to the first input terminal 40, and then supplied to the inverting input terminal through the second switch 32.

In a first step ST3100, n of the loop counter is initialized to 1. In addition, pol which shows the polarity is initialized to 1 which means the positive polarity. Furthermore, tmp for temporarily storing an arithmetic result is initialized to 0.

In a second step ST3101, $D_{DAC}$ is supplied to the D/A converter circuit 10 so that the same voltage value as $V_{REF}$ is input to the non-inverting input terminal of the amplifier circuit 20 functioning as a comparator circuit.

In a third step ST3102, the reference voltage $V_{REF}$ supplied to the inverting input terminal of the amplifier circuit 20 functioning as a comparator circuit and $V_{DAC}$ supplied to the non-inverting input terminal are compared. The comparison result from the amplifier circuit 20 functioning as a comparator circuit is output as MONI through the third switch 33, and whether MONI is H or L is determined.

Depending on the output result of MONI, the polarity variable pol is set in a fourth step ST3103. When MONI=L is obtained in the step ST3102, $V_{OFF}$ is lower than $V_{REF}$. Accordingly, pol=−1 is set to perform negative offset detection operation. When MONI=H, $V_{OFF}$ is higher than $V_{REF}$, so that the positive offset detection operation is performed.

The positive offset process is described. When MONI=H is obtained in the step ST3102, $V_{OFF}$ is a positive value.

In a fifth step ST3104, the next comparison conditions of $D_{DAC}$ are set. The set digital signal $D_{DAC}$ is calculated by Equation (6).

$$D_{DAC}=D_{REF}+(pol \times 2^{SET} \times tmp) \qquad (6)$$

If pol=1 is obtained in the sixth step ST3105, the process goes to ST3106 for the positive offset process.

In the (7-A)-th step ST3106, if MONI which is the output from the amplifier circuit 20 functioning as a comparator circuit is H, the process goes to ST3107. If MONI is L, the process goes to ST3107a.

In a (7-B)-th step ST3116, if MONI which is the output from the amplifier circuit 20 functioning as a comparator circuit is H, the process goes to ST3107. If MONI is L, the process goes to ST3107b.

In the eighth step ST3107, the next comparison conditions of $V_{DAC}$ are set. The set value is calculated by Equation (7).

$$tmp=tmp+\tfrac{1}{2}^n \qquad (7)$$

In the (8-A)-th step ST3107a and the (8-B)-th step ST3107b, the next comparison conditions of $V_{DAC}$ are set. The set value is calculated by Equation (14).

$$tmp=tmp-\tfrac{1}{2}^n \qquad (14)$$

In a ninth step ST3108, whether the number n of the loop counter is equal to the detection range SET is determined. When the detection range is larger, the loop counter is incremented in ST3109.

In a tenth step ST3120, $D_{OFF}$ is calculated by Equation (8).

$$D_{OFF}=pol \times 2^{SET} \times tmp \qquad (8)$$

The offset voltage can be detected using the number set as the detection range SET.

FIG. 8 shows a case in which $V_{OFF}$ is outside the set range. $V_{OFF}$ is expressed as $D_{OFF}$ when it is a digital signal. The detection of the offset voltage $D_{OFF}$ in the range from $2^{SET}$ (maximum) to $-2^{SET}$ (minimum) is possible. In an example described here, in the case where $D_{OFF}$ is not detected as a result of a search until the same number of times as SET that is set in FIG. 7, $D_{OFF}$ is expressed as overflow ($D_{OF}$) if the value of $D_{DAC}$ is on the positive side and underflow ($D_{UF}$) if the value of $D_{DAC}$ is on the negative side. Depending on the conditions, the detection range can be widened to the maximum value (most significant bit (MSB)) or minimum value of the D/A converter circuit 10.

FIG. 8 is a flow chart of a detection method within a detection range. In order to detect $V_{OFF}$ which is generated owing to variations in the D/A converter circuit 10 and the amplifier circuit 20 in the semiconductor device 100 in FIG. 4B, conditions of MODE 2 are selected, so that the amplifier circuit 20 operates as a comparator circuit.

At START in FIG. 8, the control signal TM in FIG. 4B is set to be High so that MODE 2 is selected. In a period in MODE 2, the first switch 31 and the fourth switch 34 are off and the second switch 32 and the third switch 33 are on. A reference voltage $V_{REF}$ is supplied to the first input terminal 40, and then supplied to the inverting input terminal through the second switch 32.

In a first step ST3200, n of the loop counter is initialized to 1. In addition, the variable pol which shows the polarity is initialized to 1 which means the positive polarity. Furthermore, the variable imp for temporarily storing an arithmetic result is initialized to 1.

In a second step ST3201, $D_{DAC}$ is supplied to the D/A converter circuit 10 so that the same voltage value as the voltage supplied to the inverting input terminal is input to the non-inverting input terminal of the amplifier circuit 20 functioning as a comparator circuit from the D/A converter circuit 10.

In a third step ST3202, the reference voltage $V_{REF}$ supplied to the inverting input terminal of the amplifier circuit 20 functioning as a comparator circuit and $V_{DAC}$ supplied to the non-inverting input terminal are compared. The comparison result from the amplifier circuit 20 functioning as a comparator circuit is output as MONI through the third switch 33, and whether MONI is H or L is determined.

Depending on the output result of MONI, the polarity variable pol is set in a fourth step ST3203. When MONI=L is obtained in the step ST3202, $V_{OFF}$ is lower than $V_{REF}$. Accordingly, pol=−1 is set to perform negative offset detection operation. When MONI=H, $V_{OFF}$ is higher than $V_{REF}$, so that the positive offset detection operation is performed.

The positive offset process is described. When MONI=H is obtained in the step ST3202, $V_{OFF}$ is a positive value.

In a fifth step ST3204, the next comparison conditions of $D_{DAC}$ are set. The set $D_DAC$ is calculated by Equation (9).

$$V_{DAC}=V_{REF}+(pol \times 2^{SET}) \qquad (9)$$

If pol=1 is obtained in a sixth step ST3205, the process goes to ST3206 for the positive offset process.

In a (7-A)-th step ST3206, if MONI which is the output from the comparator circuit is H, the process goes to a step ST3207. If MONI is L, the process goes to a step ST3217a.

In the (8-A)-th step ST3207, $D_{DAC}$ is decremented, and then the process goes to a step ST3208. In an (8-B)-th step ST3217a, $D_{DAC}$ is incremented, and then the process goes to a step ST3208a.

If pol=−1 is obtained in the sixth step ST3205, the process goes to ST3216 for the negative offset process.

In a (7-B)-th step ST3216, if MONI which is the output from the comparator circuit is H, the process goes to ST3207. If MONI is L, the process goes to a step ST3217b.

In the (8-C)-th step ST3217b, $D_{DAC}$ is incremented, and then the process goes to a step ST3208b.

In the ninth step ST3208, the step ST3208a, and the step ST3208b, whether the number n of the loop counter is equal to the detection range SET is determined. When SET=n is obtained in the step ST3208, the process goes to a step ST3220. When SET=n is obtained in the step ST3208a, the process goes to a step ST3221. When SET=n is obtained in the step ST3208b, the process goes to a step ST3222. In each of the steps ST3208, ST3208a, and ST3208b, when SET>n is obtained, the number n of the loop counter is incremented in ST3209 and the process goes to ST3204.

In the (10-A)-th step ST3220, the $V_{OFF}$ detection result is calculated by Equation (4).

In a (10-B)-th step ST3221, it is judged that no detection of $V_{OFF}$ on the positive side is the result of overflow, and $D_{OFF}=D_{OF}$ is provided. As $D_{OF}$, a particularly determined output code or another alarm signal may be output.

In the (10-C)-th step ST3222, it is judged that no detection of $V_{OFF}$ on the negative side is the result of underflow, and $D_{OFF}=D_{UF}$ is provided. As $D_{UF}$, a particularly determined output code or another alarm signal may be output.

$D_{OFF}$ can be detected within the range that is set as the detection range SET. When $D_{OFF}$ is not detected within the detection range SET, overflow ($D_{OF}$) is output as $D_{OFF}$ if the value of $D_{DAC}$ is on the positive side and underflow ($D_{UF}$) is output as $D_{OFF}$ if the value of $D_{DAC}$ is on the negative side.

The structure and method described in this embodiment can be implemented by being combined as appropriate with any of the other structures and methods described in the other embodiments.

Embodiment 3

In this embodiment, a display device 50 in which variations are controlled will be described with reference to FIGS. 9A and 9B. In Embodiment 1, the semiconductor device 101 having a function of converting a digital signal into an analog signal and converting the analog signal into a signal having low impedance by an amplifier circuit has been described.

A method for utilizing $V_{OFF}$ which is detected in Embodiment 1 or 2 for data output to a source driver is described. The display device 50 in FIG. 9A includes a source driver 51 including the 12-bit D/A converter circuit illustrated in FIG. 3, an operational circuit 52, a frame memory 53, a memory 54 which stores the detected $D_{OFF}$, and a display 55.

The source driver 51 includes a shift register circuit 56, a data latch circuit 57, a latch circuit 58, and the semiconductor device 101.

For example, the $D_{OFF}$ memory has an 8-bit data width. The operational circuit 52 performs an operation on two memory values with an adder circuit or a subtracter circuit. Although an operational circuit is used as an example, the same result can be obtained by performing an operation with a program.

The offset voltage $V_{OFF}$ is stored in the memory 54 as the digital signal $D_{OFF}$. The operational circuit 52 performs an operation on data from the frame memory 53 and data from the memory 54 and sends offset-corrected data to the source driver 51, leading to display on the display 55. By performing an operation on the digital signal in the frame memory 53 using $D_{OFF}$, $V_{OFF}$ of the D/A converter circuit 10 or the amplifier circuit 20 in FIG. 3, which are included in the source driver 51, is corrected and conversion into a correct grayscale voltage is achieved.

Figure 9A:
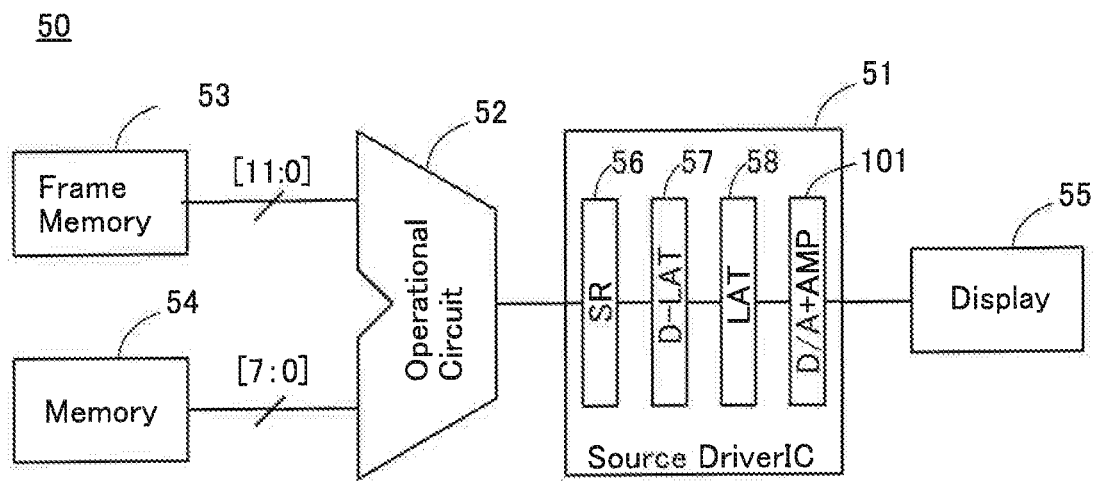
FIG. 9A is a block diagram of a semiconductor device, and FIG. 9B schematically shows a determination process.
Figure 9B:
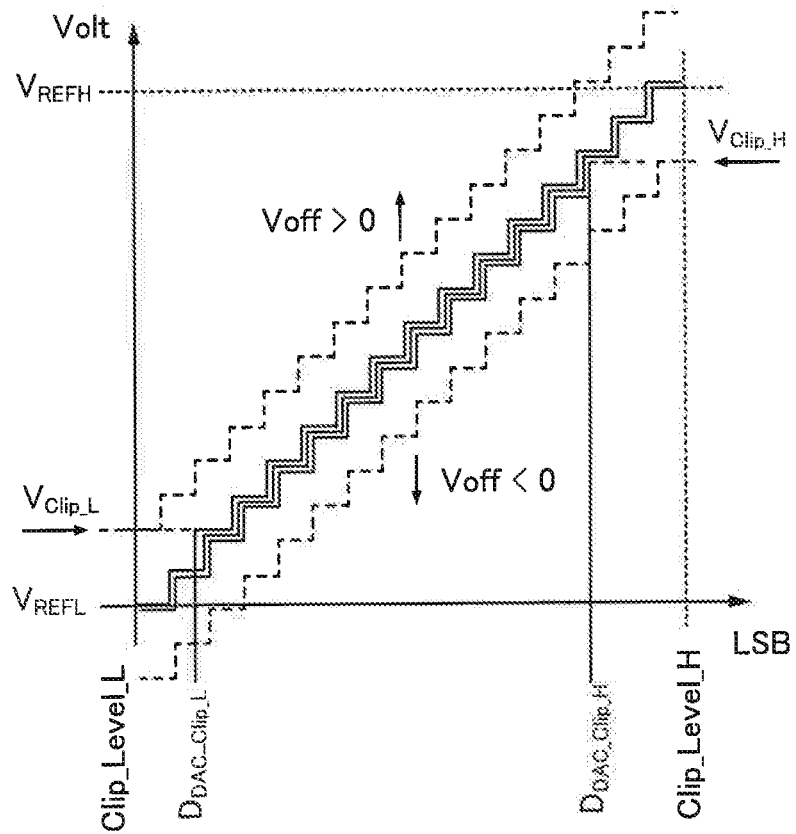

FIG. 9B shows an example of a method for performing an operation on the circuit illustrated in FIG. 9A. The maximum output voltage and the minimum output voltage of the analog signal from the D/A converter circuit 10 are referred to as $V_{REFH}$ and $V_{REFL}$, respectively. When the digital signal $D_{DAC}$ is corrected using $V_{OFF}$, the maximum set value and the minimum set value of the output range are referred to as Clip_Level_H and Clip_Level_L, respectively. The output range corrected using $V_{OFF}$ is within the voltage output range between $V_{REFH}$ and $V_{REFL}$. The output voltage is clipped at the maximum value Clip_Level_H and the minimum value Clip_Level_L.

When $V_{OFF}>0$, the output of DAC is corrected to the positive side, and can be expressed by Equation (10) and Equation (11).

$$DAC_{Clip\_L}=D_{OFF} \tag{10}$$

$$DAC_{Clip\_H}=\text{Clip\_Level\_H} \tag{11}$$

When $V_{OFF}<0$, the output of DAC is corrected to the negative side, and can be expressed by Equation (12) and Equation (13).

$$DA_{Chip\_L}=\text{Clip\_Level\_L} \tag{12}$$

$$DA_{Chip\_H}=\text{Clip\_Level\_H}-D_{OFF} \tag{13}$$

The influence of $D_{OFF}$ is corrected by the method for operating the circuit illustrated in FIG. 9A; thus, a correct digital signal can be supplied to the source driver 51.

The structure and method described in this embodiment can be implemented by being combined as appropriate with any of the other structures and methods described in the other embodiments.

Embodiment 4

In this embodiment, a semiconductor device 103 in which variations are controlled will be described with reference to FIGS. 10A and 10B.

Figure 10A:
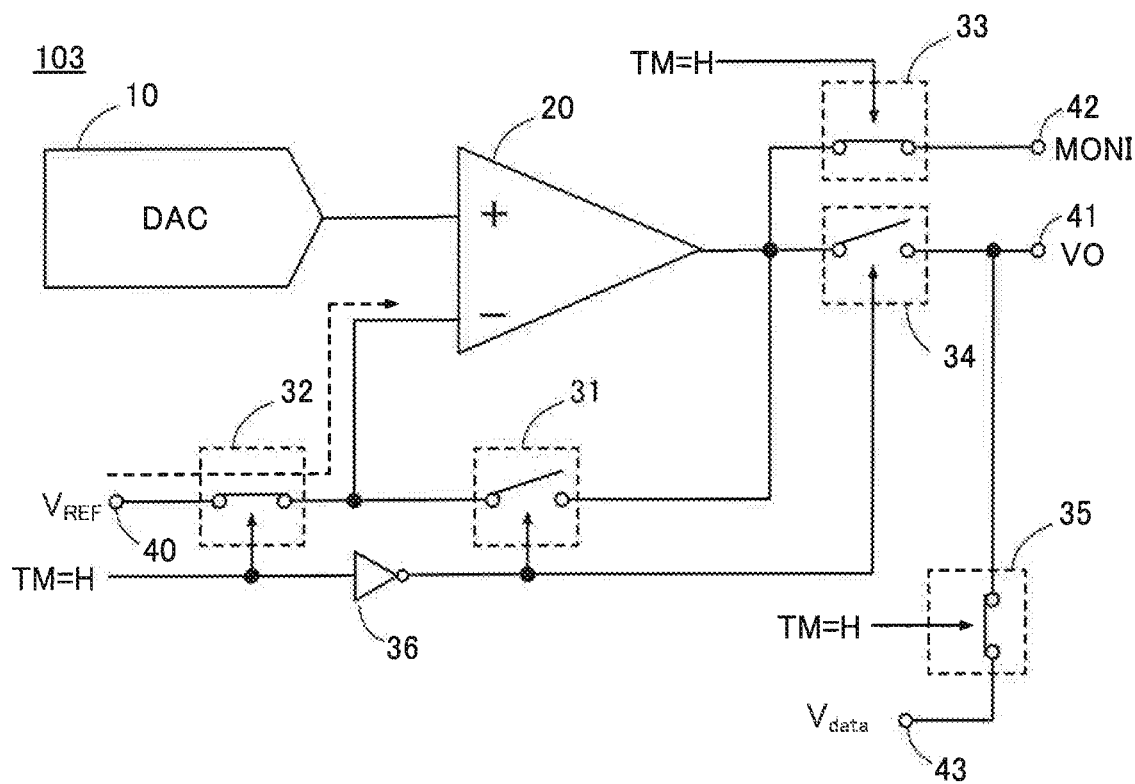
FIG. 10A is a circuit diagram of a semiconductor device, and FIG. 10B schematically shows an operation.

FIG. 10A is different from FIG. 4B in the following points. One terminal of a fifth switch 35 is connected to the fourth switch 34 and the first output terminal 41. The other terminal of the fifth switch 35 is connected to a second input terminal 43. Note that description is given below assuming that the switch 35 is an n-channel transistor, unless otherwise specified.

Table 2 shows switching conditions in MODE 3.

TABLE 2

|  | MODE 3 |
| --- | --- |
| SW 31 | OFF |
| SW 32 | ON |
| SW 33 | ON |
| SW 34 | OFF |
| SW 35 | ON |

During a period in which a High signal is supplied to the semiconductor device 103 as the control signal TM, MODE 3 is selected. The amplifier circuit 20 operates as a comparator circuit. In a period in MODE 3, the control signal TM is set to be High so that the first switch 31 and the fourth switch 34 can be off and the second switch 32, the third switch 33, and the fifth switch 35 can be on.

The second input terminal 43 is supplied with an arbitrary voltage ($V_{data}$). The fifth switch 35 has a function of being turned on when the control signal TM is High. $V_{data}$ supplied to the second input terminal 43 is output to the first output terminal 41 through the fifth switch 35.

Figure 10B:
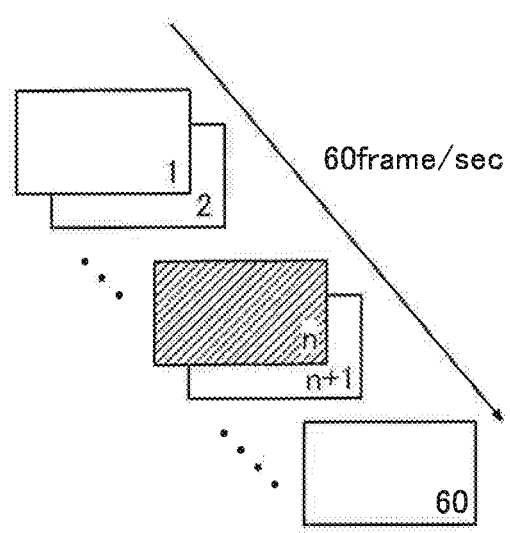

FIG. 10B illustrates an example of a $V_{OFF}$ detection method in a period when a panel is driven. A display device with 60 frames per second is taken as an example. By setting the control signal TM to be High in a period for processing the n-th frame data, the connections in MODE 3 are made. $V_{OFF}$ detection is performed in the n-th frame processing period to update $V_{OFF}$ memory data. During $V_{OFF}$ detection, $V_{data}$ supplied to the second input terminal 43 is output to the first output terminal 41 through the fifth switch 35 as an output signal VO.

In the case of the display device, the terminal from which the output signal VO is output is connected to a signal line and is supplied with $V_{data}$ as display data. For example, in the case where the minimum voltage of the data range is supplied, if the display device is an organic electroluminescence (EL) display, the supply of the minimum voltage means insertion of a frame for black display between display frames and an effect such as an improvement in contrast can be produced. If the display device is a liquid crystal display, an appropriate voltage can be supplied as $V_{data}$ depending on the kind of liquid crystal, so that the same effect as insertion of a frame for black display can be produced.

The display quality can be improved by inserting a frame for black display in a period for correcting variations which cause a degradation in display quality. Thus, a high-quality image with a suppressed influence of variations can be obtained.

The structure and method described in this embodiment can be implemented by being combined as appropriate with any of the other structures and methods described in the other embodiments.

Embodiment 5

In this embodiment, a display panel including any of the semiconductor devices 100, 101, 102, and 103 will be described.

Figure 11:
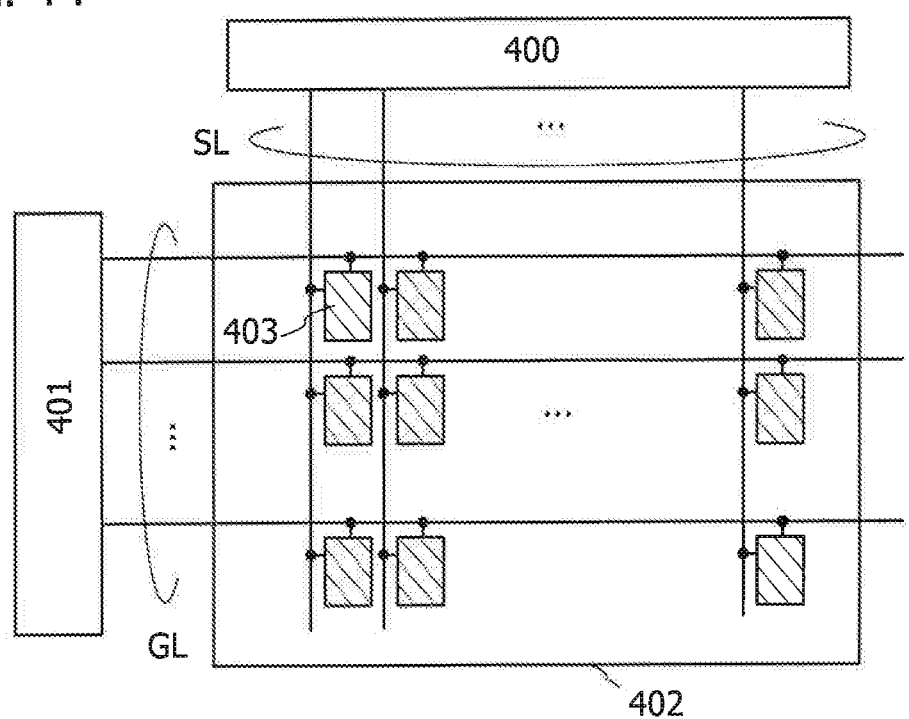
FIG. 11 is a circuit block diagram illustrating a structure example of a display panel.

A display panel in a block diagram of FIG. 11 includes a signal line driver circuit 400, a scan line driver circuit 401, and a pixel portion 402. In the pixel portion 402, pixels 403 are arranged in a matrix. The pixel portion 402 may be referred to as a display portion.

The signal line driver circuit 400 has a function of outputting image signals that have been converted into analog signals to a plurality of signal lines SL.

A circuit included in the signal line driver circuit 400 may be an IC or may be formed using the same transistor as that in the pixel 403 in the pixel portion 402. Note that a plurality of signal line driver circuits 400 may be provided to control the signal lines SL separately.

The scan line driver circuit 401 has a function of outputting scan signals to a plurality of scan lines GL. The scan line driver circuit 401 includes a shift register and a buffer, for example. The scan line driver circuit 401 receives a gate start pulse, a gate clock signal, and the like and outputs a pulse signal.

A circuit included in the scan line driver circuit 401 may be an IC or may be formed using the same transistor as that in the pixel 403 in the pixel portion 402. Note that a plurality of scan line driver circuits 401 may be provided to control the scan lines GL separately.

In the pixel portion 402, the scan lines GL and the signal lines SL are provided to intersect at substantially right angles. The pixel 403 is provided at the intersection of the scan line GL and the signal line SL. For color display, the pixels 403 corresponding to the respective colors of red, green, and blue (RGB) are arranged in sequence in the pixel portion 402. Note that the pixels of RGB can be arranged in a stripe pattern, a mosaic pattern, a delta pattern, or the like as appropriate. Without limitation to RGB, white, yellow, or the like may be added to RGB for color display.

Figure 12:
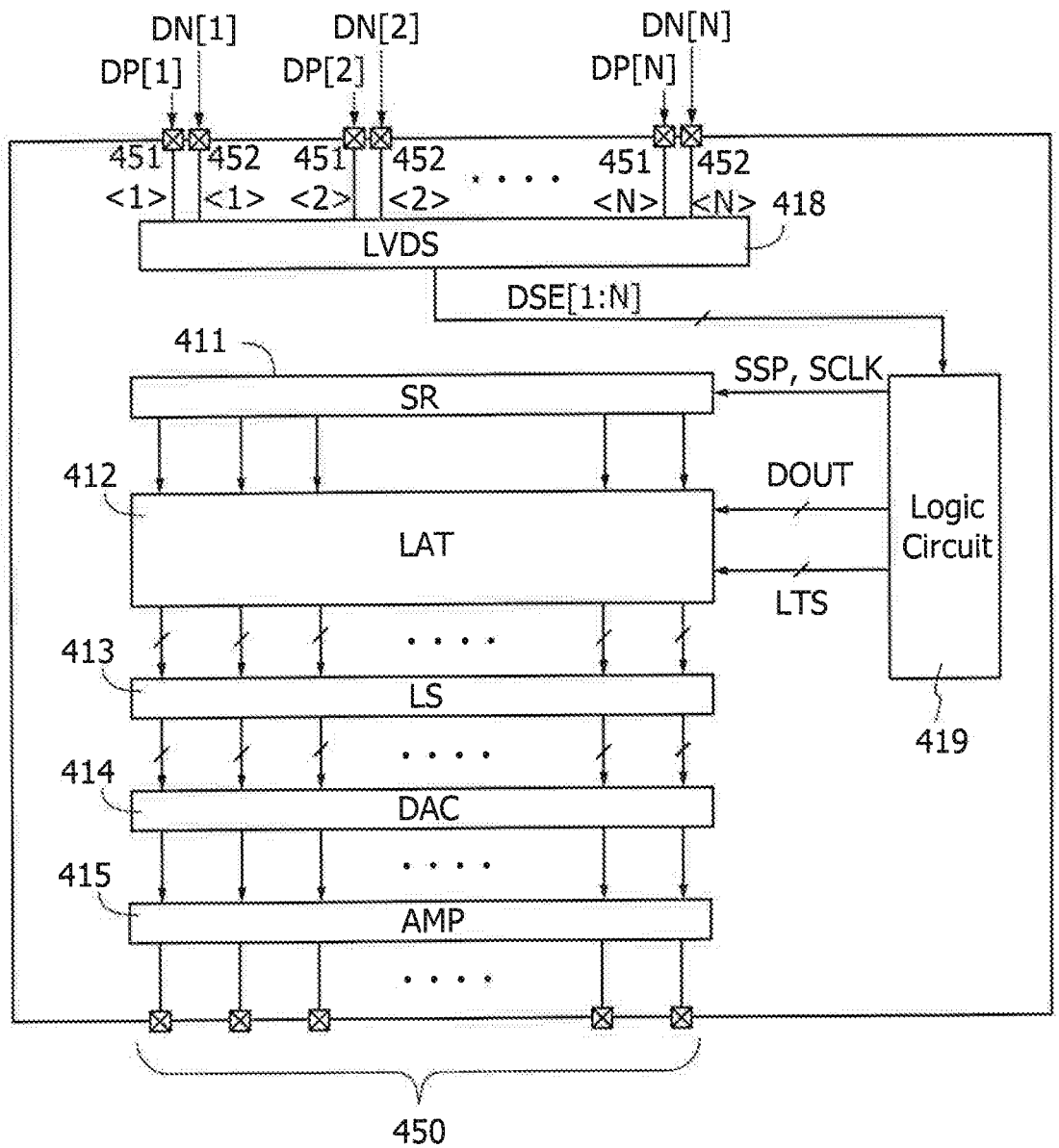
FIG. 12 is a circuit block diagram illustrating a structure example of a signal line driver circuit.

Next, the signal line driver circuit 400 is described in detail with reference to FIG. 12. A circuit block diagram in FIG. 12 shows a structure example of the signal line driver circuit 400 capable of processing an N-bit image signal.

The signal line driver circuit 400 includes terminals 450, terminals 451, terminals 452, a low-voltage differential signaling (LVDS) receiver 418, a logic circuit 419, a shift register 411, a latch circuit 412, a level shifter 413, a D/A converter circuit 414, and an amplifier circuit 415.

The terminals 450 are output terminals for an image signal that has been converted into an analog signal, and are electrically connected to the signal lines SL. The terminals 451 and 452 are input terminals for differential signals. For example, a signal whose logic is inverted with respect to that of an input signal of the terminal 451<1> is input to the terminal 452<1>. For example, image signals DP[1] to DP[N] are input to the terminals 451<1> to 451<N>, respectively, and image signals DN[1] to DN[N] are input to the terminals 452<1> to 452<N>, respectively.

To the terminals 451 and 452, not only the image signals DP[1:N] and DN[1:N] but also command signals are input. The signal line driver circuit 400 is provided with, in addition to the terminals 450, 451, and 452, an input terminal for a power supply voltage, input terminals for various signals, output terminals for various signals, and the like.

The LVDS receiver 418 has a function of converting input differential signals into a single-ended signal. The LVDS receiver 418 converts the image signals DP[1:N] and DN[1:N] into a single-ended image signal DSE.

The logic circuit 419 has a function of controlling the circuits included in the signal line driver circuit 400 in accordance with a command signal or the like input from the outside. Specifically, the logic circuit 419 generates signals SSP, SCLK, LTS, and the like. The signals SSP and SCLK are control signals for the shift register 411. The signal LTS is a control signal for the latch circuit 412.

The logic circuit 419 has a function of converting a serial image signal DSE into a parallel image signal DOUT (serial-to-parallel conversion function).

The shift register 411 includes a plurality of flip-flop (FF) circuits. The signal SSP (start pulse signal) is input to the first FF circuit, whereby a sampling signal is output from each FF circuit at predetermined timing. The timing at which each FF circuit outputs the sampling signal is controlled by the signal SCLK (clock signal).

The latch circuit 412 samples the image signal DOUT in accordance with the sampling signal and stores the image signal DOUT. The timing at which the latch circuit 412 outputs the stored image signal is controlled with the signal LTS.

The level shifter 413 has a function of boosting the image signal output from the latch circuit 412 and outputting it.

The D/A converter circuit 414 has the structure of the semiconductor device 100 described in Embodiment 1. With such a structure, a reduction in circuit area and an improvement in display quality can be achieved.

The amplifier circuit 415 has a function of amplifying the image signal (analog signal) output from the D/A converter circuit 414 and outputting it to the signal lines SL. Note that the amplifier circuit 415 is referred to as an output circuit in some cases.

Next, a structure example of a circuit that can be used for the pixel 403 is described.

Figure 13A:
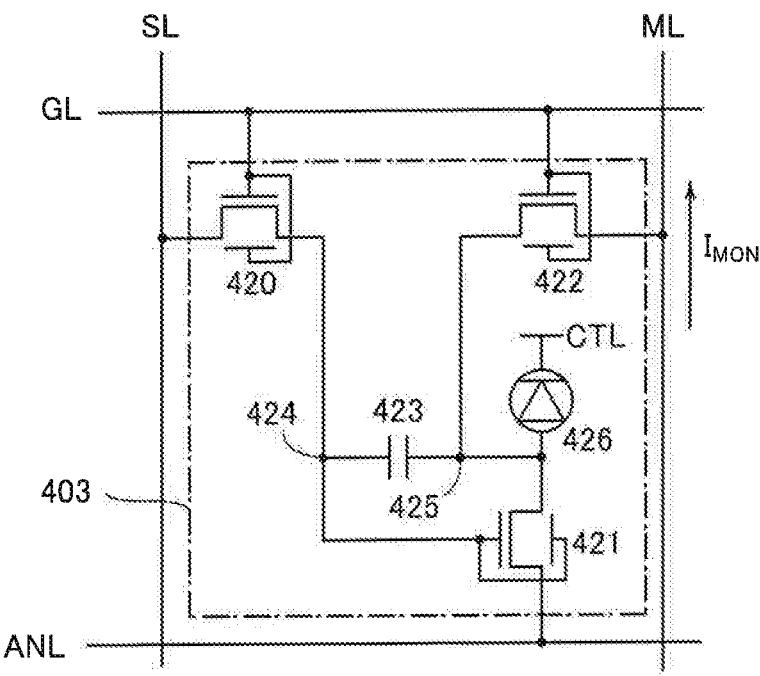
FIG. 13A is a circuit diagram illustrating a structure example of a pixel.
Figure 13B:
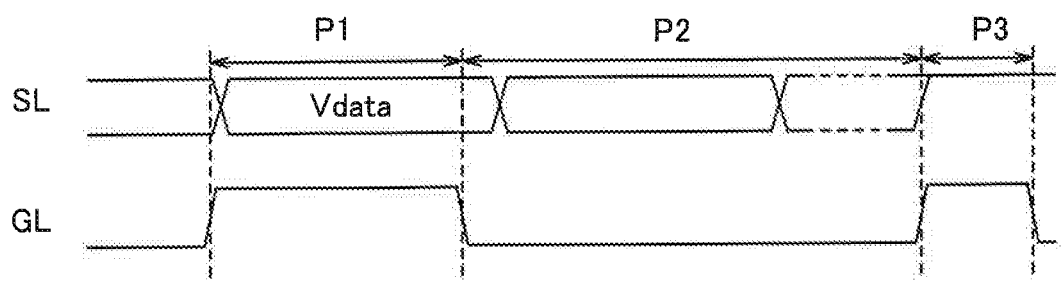
FIG. 13B is a timing chart illustrating an operation example of the pixel.

FIG. 13A illustrates an example of the pixel 403 that can be used for a panel including a light-emitting element. FIG. 13B is a timing chart showing an operation example of the pixel 403 illustrated in FIG. 13A.

The pixel 403 is electrically connected to the scan line GL, the signal line SL, a wiring ML, a wiring CTL, and a wiring ANL. The pixel 403 includes transistors 420 to 422, a capacitor 423, and a light-emitting element 426.

The light-emitting element 426 includes a pair of terminals (an anode and a cathode). As the light-emitting element 426, an element which can control the luminance with current or voltage can be used. As the light-emitting element 426, a light-emitting element utilizing electroluminescence (also referred to as an EL element) can be used. An EL element includes a layer containing a light-emitting compound (also referred to as an EL layer) between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light. EL elements are classified according to whether a light-emitting material is an organic compound or an inorganic compound. In general, the former is referred to as an organic EL element (organic light-emitting diode (OLED)), and the latter is referred to as an inorganic EL element.

Although the transistors 420 to 422 are n-channel transistors in FIG. 13A, one or more, or all of the transistors 420 to 422 may be p-channel transistors. The transistors 420 to 422 each include a back gate electrically connected to a gate. With such a device structure, the current drive capability of the transistors 420 to 422 can be improved. One or more, or all of the transistors 420 to 422 may be transistors without back gates.

The transistor 420 is a pass transistor which connects a gate of the transistor 421 (a node 424) and the signal line SL. The transistor 422 is a pass transistor which connects the wiring ML and an anode of the light-emitting element 426 (a node 425). The transistor 421 is a driving transistor and functions as a source of current supplied to the light-emitting element 426. In accordance with the amount of drain current of the transistor 421, the luminance of the light-emitting element 426 is adjusted. The capacitor 423 is a storage capacitor which stores voltage between the node 425 and the node 424.

Variation in the drive capability of the transistors 421 in the pixels 403 causes variation in the luminance of the light-emitting elements 426, which results in decrease in display quality. The pixels 403 in FIG. 13A have a function of correcting variation in the luminance of the light-emitting elements 426 by monitoring drain currents of the transistors 421.

FIG. 13B shows an example of a timing chart of a potential of the scan line GL illustrated in FIG. 13A and a potential of the image signal supplied to the signal line SL. Note that the timing chart of FIG. 13B is an example in which all the transistors included in the pixel 403 are n-channel transistors.

A period P1 is a writing operation period and the light-emitting element 426 does not emit light during the period. A high-level potential is supplied to the scan line GL, and the transistors 420 and 422 are turned on. A potential $V_{data}$ is supplied to the signal line SL as an image signal. The potential $V_{data}$ is supplied to the node 424 through the transistor 420.

In the case where the transistor 421 is an n-channel type, it is preferable that, in the period P1, the potential of the wiring ML be lower than the sum of the potential of the wiring CTL and the threshold voltage Vthe of the light-emitting element 426. With the above structure, the drain current of the transistor 421 can be made to flow preferentially through the wiring ML instead of the light-emitting element 426.

A period P2 is a light emission period and the light-emitting element 426 emits light during the period. A low-level potential is supplied to the scan line GL, and the transistors 420 and 422 are turned off. When the transistor 420 is turned off, the potential $V_{data}$ is held at the node 424. A potential Vano is supplied to the wiring ANL, and a potential Vcat is supplied to the wiring CTL. The potential Vano is preferably higher than the sum of the potential Vcat and the threshold voltage Vthe of the light-emitting element 426. The potential difference between the wiring ANL and the wiring CTL allows the drain current of the transistor 421 to flow into the light-emitting element 426; thus, the light-emitting element 426 emits light.

A period P3 is a monitor period in which the drain current of the transistor 421 is obtained. A high-level potential is supplied to the scan line GL, and the transistors 420 and 422 are turned on. In addition, such a potential that the gate voltage of the transistor 421 is higher than the threshold voltage Vth thereof is supplied to the signal line SL. The potential of the wiring ML is preferably lower than the sum of the potential of the wiring CTL and the threshold voltage Vthe of the light-emitting element 426. With the above structure, the drain current of the transistor 421 can be made to flow preferentially through the wiring ML instead of the light-emitting element 426.

A current $I_{MON}$ output from the pixel 403 to the wiring ML in the period P3 corresponds to the drain current flowing into the transistor 421 during the light emission period. The current $I_{MON}$ is supplied to a monitor circuit. The monitor circuit analyzes the current $I_{MON}$ and generates a correction signal on the basis of the analysis result. Through the operation, deviation of the luminance of the pixels 403 can be corrected.

The monitor operation is not necessarily performed after the light-emitting operation. For example, in the pixel 403, the monitor operation can be performed after the cycle of data writing operation and light-emitting operation is repeated a plurality of times. Alternatively, after the monitor operation, the light-emitting element 426 may be brought into a non-light-emitting state by writing a data signal corresponding to the lowest grayscale level [0] to the pixel 403.

Figure 14A:
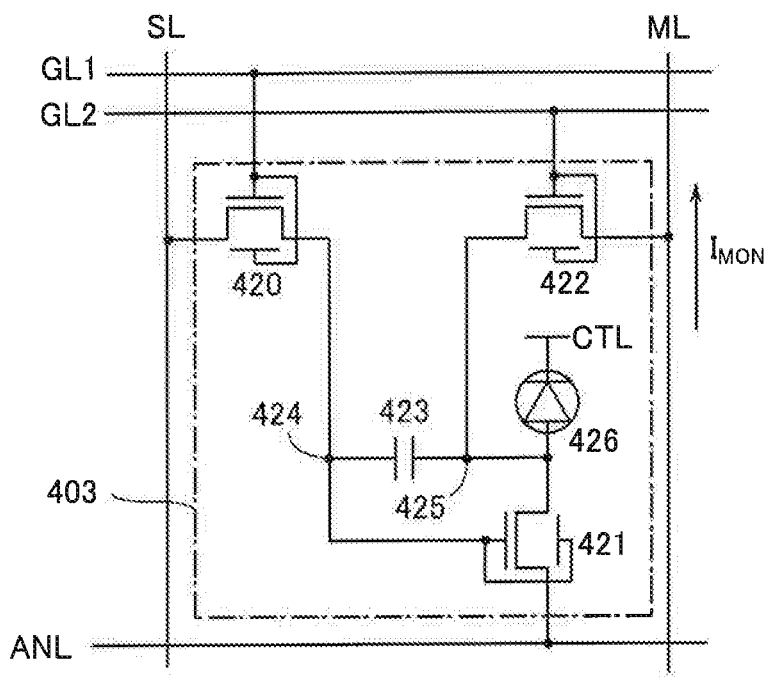
FIGS. 14A and 14B are circuit diagrams each illustrating a structure example of a pixel.

The pixel 403 illustrated in FIG. 13A may be connected to a plurality of scan lines. A circuit diagram of such a case is illustrated in FIG. 14A. In the pixel 403 illustrated in FIG. 14A, the gate of the transistor 420 is electrically connected to a scan line GL1, and the gate of the transistor 422 is electrically connected to a scan line GL2. With such a structure, the transistors 420 and 422 can be individually turned on and off and the timing of the monitor operation can be controlled more freely.

Figure 14B:
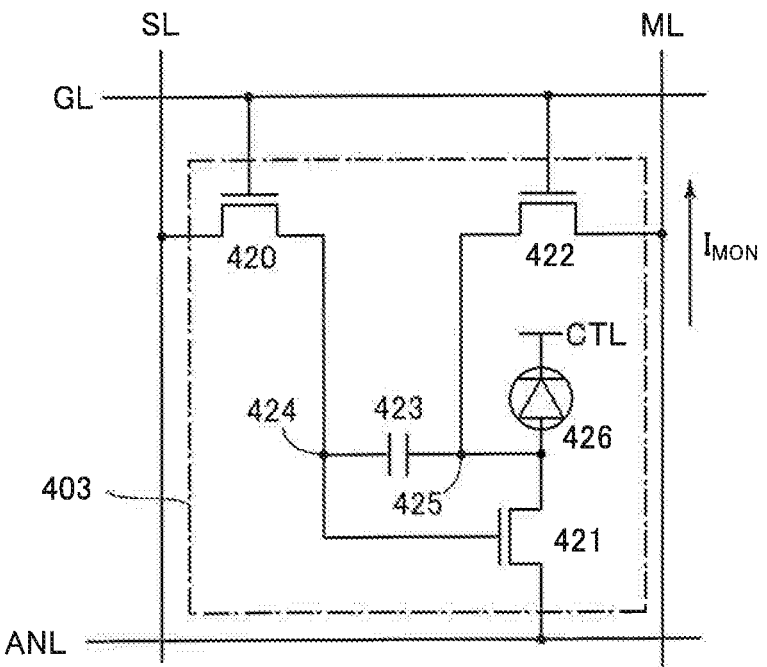

In the pixel 403 illustrated in FIG. 13A, the transistors 420 to 422 do not necessarily include back gates. FIG. 14B illustrates a circuit diagram of that case. The structure illustrated in FIG. 14B can facilitate the manufacturing process of the pixel 403.

Figure 15A:
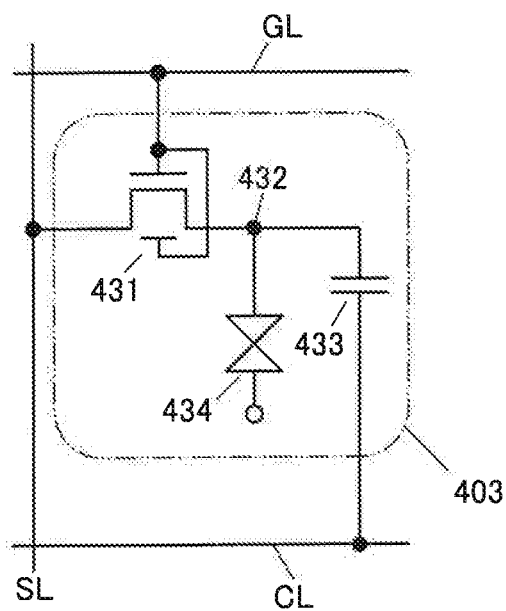
FIGS. 15A and 15B are circuit diagrams each illustrating a structure example of a pixel.

FIG. 15A illustrates an example of a pixel circuit that can be used for a panel including a liquid crystal element. The pixel 403 illustrated in FIG. 15A includes a transistor 431, a capacitor 433, and a liquid crystal element 434 functioning as a display element.

Figure 15B:
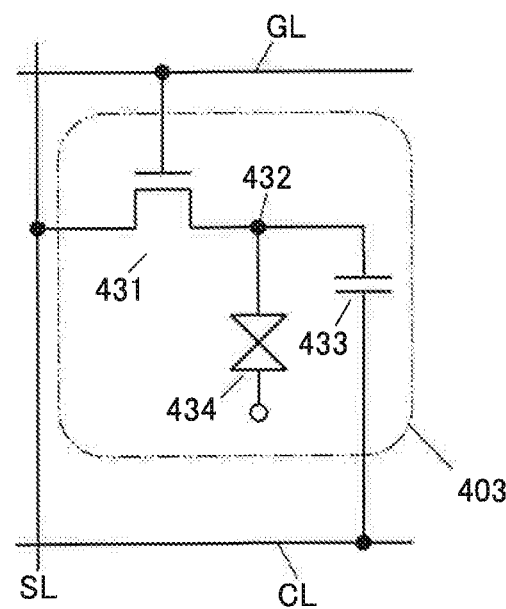

A gate of the transistor 431 is electrically connected to the scan line GL. A first terminal of the transistor 431 is electrically connected to the signal line SL. A second terminal of the transistor 431 is electrically connected to a first terminal of the capacitor 433 and a first terminal of the liquid crystal element 434. A node of the second terminal of the transistor 431, the first terminal of the capacitor 433, and the first terminal of the liquid crystal element 434 is referred to as a node 432. The transistor 431 has a function of controlling whether to write a data signal to the node 432. In FIG. 15B, a gate of the transistor 431 is electrically connected to a backgate of the transistor 431. In this specification, a first gate is simply referred to as "a gate", and a second gate is referred to as "a backgate", in some cases. The gate and the backgate of the transistor 431 preferably have an overlapping region with a channel formation region therebetween. In the transistor 431, the channel formation region is electrically surrounded by electric fields from the gate electrode (first gate electrode) and the backgate electrode (second gate electrode). This device structure is referred to as a surrounded channel (s-channel) structure.

A second terminal of the capacitor 433 is electrically connected to a wiring (also referred to as a capacitor line CL) to which a particular potential is supplied. The potential of the capacitor line CL is set in accordance with the specifications of the pixel 403 as appropriate. The capacitor 433 functions as a storage capacitor for storing data written to the node 432.

The potential of a second terminal of the liquid crystal element 434 is set in accordance with the specifications of the pixel 403 as appropriate. The alignment state of a liquid crystal in the liquid crystal element 434 depends on data written to the node 432. A common potential may be supplied to the second terminal of the liquid crystal element 434 included in each of the pixels 403.

As examples of a mode of the liquid crystal element 434, any of the following modes can be given: a twisted nematic (TN) mode, a super twisted nematic (STN) mode, a vertical alignment (VA) mode, an axially symmetric aligned microcell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, and a transverse bend alignment (TBA) mode. Other examples of the mode include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various modes can be employed.

Here, an operation example of the display panel including the pixel 403 illustrated in FIG. 15A is described. The pixels 403 are sequentially selected row by row by the scan line driver circuit 401, whereby the transistor 431 is turned on and a data signal is written to the node 432.

Then, the transistor 431 is turned off and the data signal written to the node 432 is stored. The amount of light transmitted through the liquid crystal element 434 is determined in accordance with the data signal written to the node 432. This operation is sequentially performed row by row; thus, an image can be displayed on the display region.

Embodiment 6

In this embodiment, a more specific structure example of the display panel described in the above embodiments is described with reference to FIGS. 16A to 16C, FIGS. 17A to 17C, FIGS. 18A and 18B, FIGS. 19A and 19B, and FIGS. 20A and 20B. In this embodiment, a display panel including a liquid crystal element and a display panel including a light-emitting element are described as examples of the display panel.

Figure 16A:
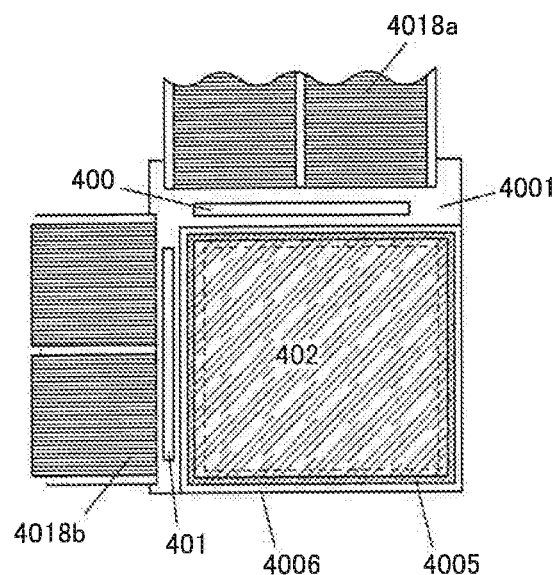
FIGS. 16A to 16C are top views each illustrating a structure example of a display panel.
Figure 16B:
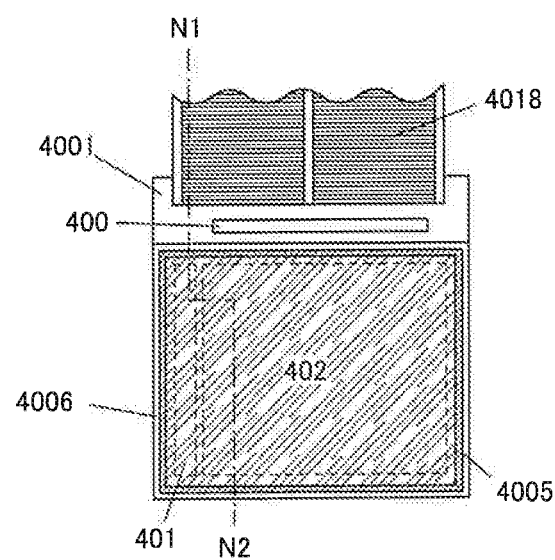
Figure 16C:
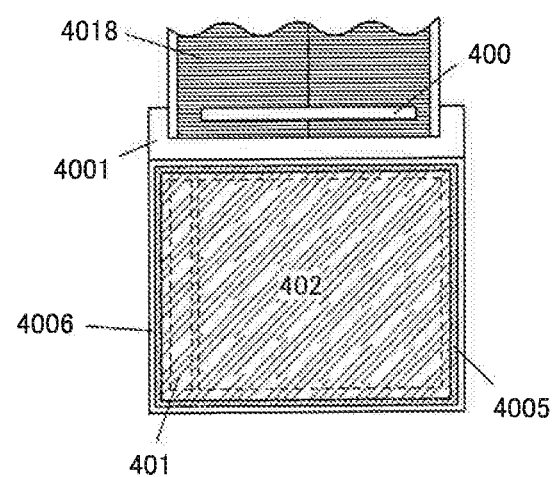

FIGS. 16A to 16C are top views each illustrating a structure example of a display panel.

In FIG. 16A, a sealant 4005 is provided so as to surround the pixel portion 402 provided over a first substrate 4001, and the pixel portion 402 is sealed by the sealant 4005 and a second substrate 4006. In FIG. 16A, the signal line driver circuit 400 and the scan line driver circuit 401 are each formed using a single crystal semiconductor or a polycrystalline semiconductor over a substrate separately prepared and mounted in a region different from the region surrounded by the sealant 4005 over the first substrate 4001. Various signals and potentials are supplied to the signal line driver circuit 400, the scan line driver circuit 401, and the pixel portion 402 from flexible printed circuits (FPCs) 4018a and 4018b.

In FIGS. 16B and 16C, the sealant 4005 is provided so as to surround the pixel portion 402 and the scan line driver circuit 401 which are provided over the first substrate 4001. The second substrate 4006 is provided over the pixel portion 402 and the scan line driver circuit 401. Consequently, the pixel portion 402 and the scan line driver circuit 401 are sealed together with a display element by the first substrate 4001, the sealant 4005, and the second substrate 4006. In FIGS. 16B and 16C, the signal line driver circuit 400 formed using a single crystal semiconductor or a polycrystalline semiconductor over a substrate separately prepared is mounted in a region different from the region surrounded by the sealant 4005 over the first substrate 4001. In FIGS. 16B and 16C, various signals and potentials are supplied to the signal line driver circuit 400, the scan line driver circuit 401, and the pixel portion 402 from an FPC 4018.

In FIGS. 16B and 16C, examples in which a circuit formed through a process different from that of the pixel portion 402, such as an IC, is provided as the signal line driver circuit 400 over the first substrate 4001 are illustrated; however, the structure is not limited to these examples. The scan line driver circuit 401 may be formed using an IC or the like, or only part of the signal line driver circuit 400 or only part of the scan line driver circuit 401 may be formed using an IC or the like.

The connection method of a driver circuit formed using an IC or the like is not particularly limited; wire bonding, chip on glass (COG), tape carrier package (TCP), chip on film (COF), or the like can be used. FIG. 16A illustrates an example in which the signal line driver circuit 400 and the scan line driver circuit 401 are mounted by COG. FIG. 16B illustrates an example in which the signal line driver circuit 400 is mounted by COG. FIG. 16C illustrates an example in which the signal line driver circuit 400 is mounted by TCP.

Figure 17A:
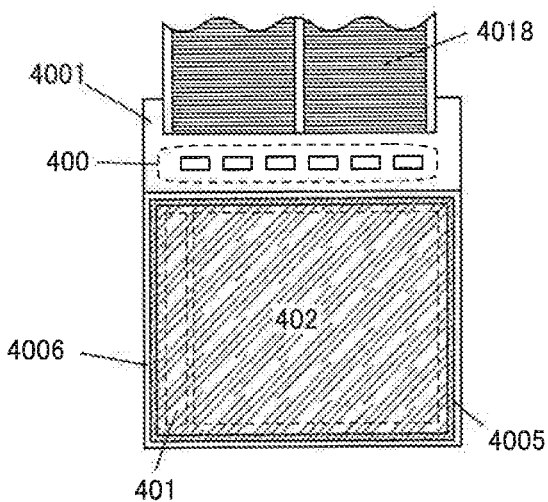
FIGS. 17A to 17C are top views each illustrating a structure example of a display panel.

In the case where the signal line driver circuit 400 is formed using an IC, the number of ICs is not limited to one and the signal line driver circuit 400 may include a plurality of ICs. Similarly, in the case where the scan line driver circuit 401 is formed using an IC, the number of ICs is not limited to one and the scan line driver circuit 401 may include a plurality of ICs. FIG. 17A illustrates an example in which six ICs are used for the signal line driver circuit 400. The signal line driver circuit including a plurality of ICs can achieve higher definition of the pixel portion 402.

Figure 17B:
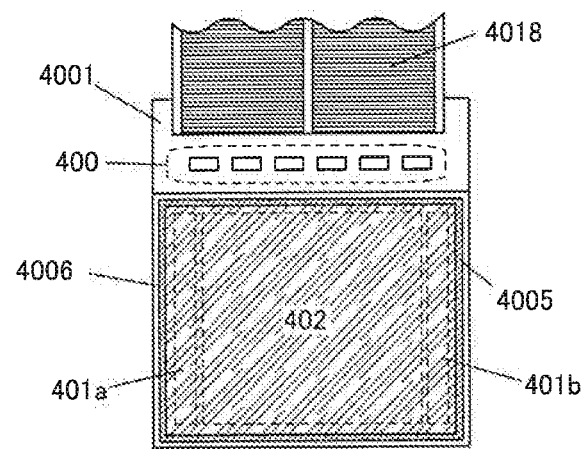

The scan line driver circuit 401 may be provided on both the left and right sides of the pixel portion 402. FIG. 17B illustrates a structure example of the case where a scan line driver circuit 401a and a scan line driver circuit 401b are provided on the left and right sides of the pixel portion 402.

Figure 17C:
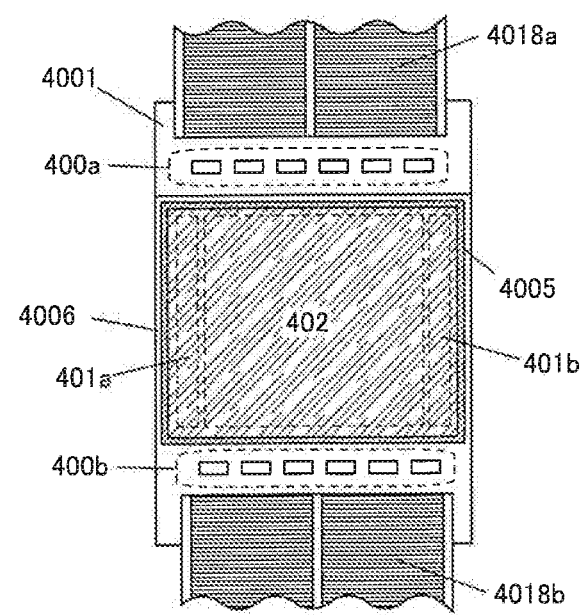
Figure 18A:
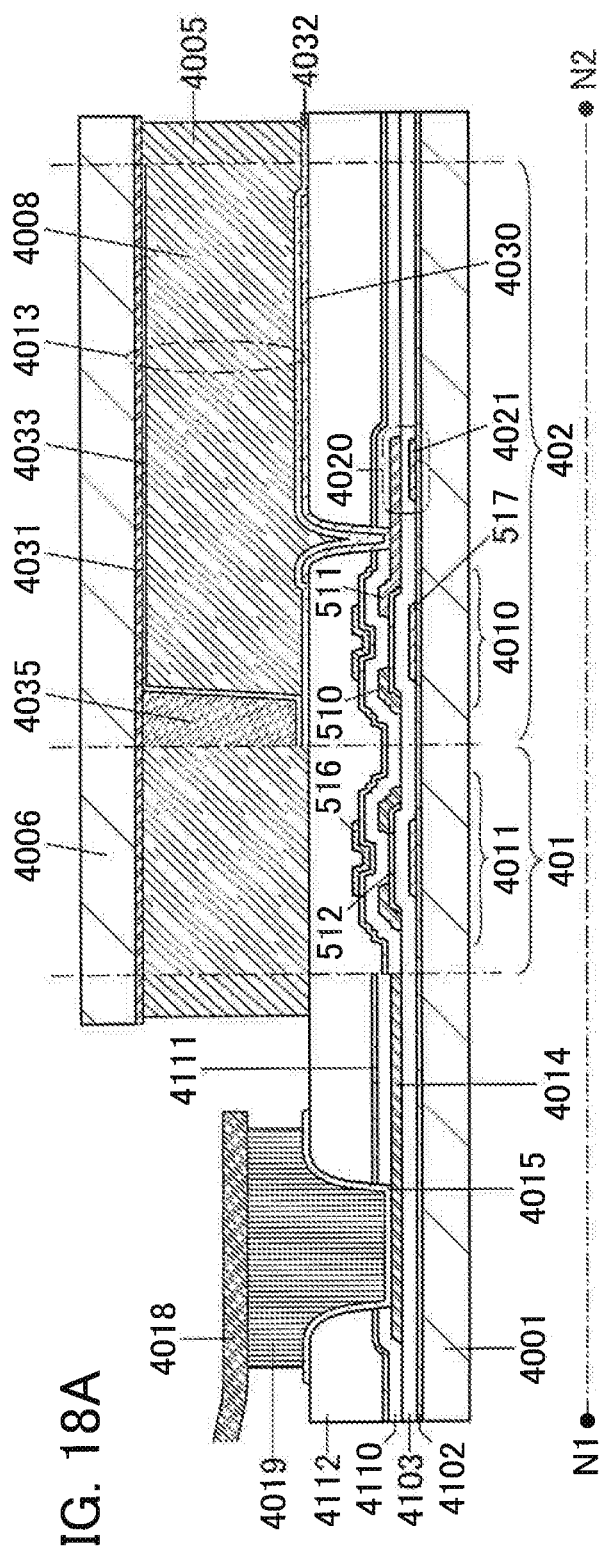
FIGS. 18A and 18B are cross-sectional views each illustrating a structure example of a display panel.
Figure 18B:
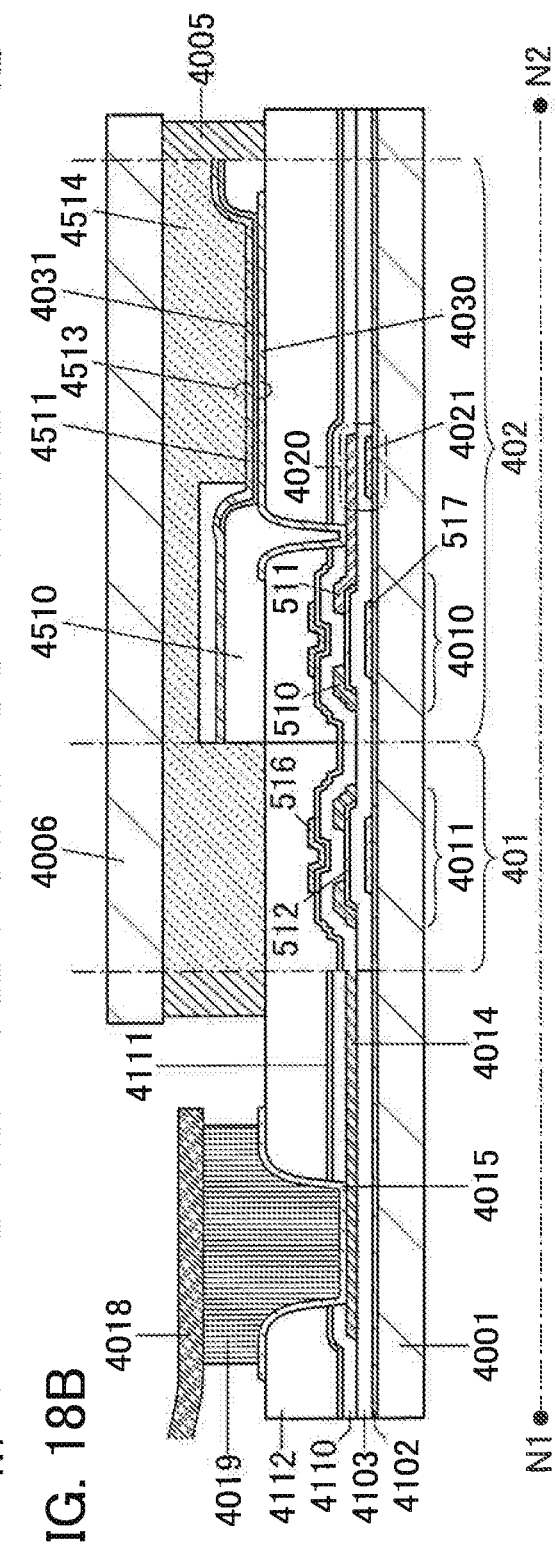

The signal line driver circuit 400 may be provided along both the top and bottom sides of the pixel portion 402. FIG. 17C illustrates a structure example of the case where a signal line driver circuit 400a and a signal line driver circuit 400b are provided along the top and bottom sides of the pixel portion 402. Each of the signal line driver circuits includes six ICs. FIGS. 18A and 18B correspond to cross-sectional views taken along chain line N1-N2 in FIG. 16B.

As shown in FIGS. 18A and 18B, the display panel has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110. The electrode 4015 is formed of the same conductive layer as a first electrode layer 4030.

The pixel portion 402 and the scan line driver circuit 401 provided over the first substrate 4001 each include a plurality of transistors. In each of FIGS. 18A and 18B, a transistor 4010 included in the pixel portion 402 and a transistor 4011 included in the scan line driver circuit 401 are illustrated. The insulating layer 4112 is provided over the transistors 4010 and 4011 in FIG. 18A, and a bank 4510 is further provided over the insulating layer 4112 in FIG. 18B.

The transistors 4010 and 4011 are provided over an insulating layer 4102. The transistors 4010 and 4011 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed of the same conductive layer as the wiring 4014.

In each of the transistors 4010 and 4011, the electrode 517 functions as a gate electrode, the electrode 510 functions as one of a source electrode and a drain electrode, the electrode 511 functions as the other of the source electrode and the drain electrode, and the electrode 516 functions as a back gate electrode.

Since the transistors 4010 and 4011 each include a bottom gate and a back gate, the on-state current of the transistors can be increased. Moreover, the threshold voltage of the transistors can be controlled.

In each of the transistors 4010 and 4011, the semiconductor layer 512 functions as a channel formation region. For the semiconductor layer 512, crystalline silicon, polycrystalline silicon, amorphous silicon, an oxide semiconductor, an organic semiconductor, or the like may be used. Impurities may be introduced to the semiconductor layer 512, if necessary, to increase the conductivity of the semiconductor layer 512 or control the threshold voltage of the transistor.

In the case where an oxide semiconductor is used for the semiconductor layer 512, the semiconductor layer 512 preferably includes indium (In). When an oxide semiconductor containing indium is used for the semiconductor layer 512, the carrier mobility (electron mobility) of the semiconductor layer 512 can be high. The semiconductor layer 512 is preferably an oxide semiconductor containing an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M The element M is an element having high bonding energy with oxygen, for example. The element M is an element whose bonding energy with oxygen is higher than that of indium, for example. The semiconductor layer 512 is preferably an oxide semiconductor containing zinc (Zn). When the oxide semiconductor contains zinc, the oxide semiconductor is easily crystallized in some cases.

The semiconductor layer 512 is not limited to the oxide semiconductor containing indium. The oxide semiconductor layer 512 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

The display panels illustrated in FIGS. 18A and 18B each include a capacitor 4020. The capacitor 4020 has a region in which the electrode 511 overlaps with an electrode 4021 with the insulating layer 4103 therebetween. The electrode 4021 is formed of the same conductive layer as the electrodes 517.

An example of a liquid crystal display panel using a liquid crystal element as a display element is illustrated in FIG. 18A. In FIG. 18A, a liquid crystal element 4013 which is a display element includes the first electrode layer 4030, a second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (cell gap). Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is not involved may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral material at 5 wt % or more is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. In addition, since an alignment film does not need to be provided and rubbing treatment is unnecessary, electrostatic discharge caused by the rubbing treatment can be prevented and defects and damage of the liquid crystal display panel can be reduced in the manufacturing process. Thus, the productivity of the liquid crystal display panel can be increased.

Moreover, it is possible to use a method called domain multiplication or multi-domain design, in which a pixel is divided into some regions (subpixels) and molecules are made to be aligned in different directions in their respective regions.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the specific resistivity in this specification is measured at 20° C.

In the case where the transistor 4010 is an oxide semiconductor transistor, the transistor 4010 can have a small current in an off-state (off-state current). Accordingly, an electric signal such as an image signal can be held for a longer period, and a writing interval can be set longer in an on state. Accordingly, the frequency of refresh operation can be reduced, which leads to an effect of suppressing power consumption.

In the display panel, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

FIG. 18B illustrates an example of a display panel including, as a display element, a light-emitting element such as an EL element. EL elements are classified into organic EL elements and inorganic EL elements.

In the organic EL element, by voltage application, electrons are injected from one electrode to an EL layer and holes are injected from the other electrode to the EL layer. The carriers (electrons and holes) are recombined, and thus, a light-emitting organic compound is excited. The light-emitting organic compound returns to a ground state from the excited state, thereby emitting light. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 18B illustrates an example in which an organic EL element is used as a light-emitting element 4513.

In FIG. 18B, the light-emitting element 4513 is electrically connected to the transistor 4010 in the pixel portion 402. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the light-emitting element be packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer 4030 and the second electrode layer 4031 can each be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 can each also be formed using one or a plurality of kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

Alternatively, a conductive composition containing a conductive high molecule (also called a conductive polymer) can be used for the first electrode layer 4030 and the second electrode layer 4031. As the conductive high molecule, a so-called π-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element 4513 to the outside, at least one of the first electrode layer 4030 and the second electrode layer 4031 is transparent. In accordance with how to extract light, the structures of the display panels are classified into a top emission structure, a bottom emission structure, and a dual emission structure. In the top emission structure, light is extracted through the surface (top surface) that is positioned opposite to the substrate where a transistor and a light-emitting element are formed. In the bottom emission structure, light is extracted through a surface (bottom surface) of the substrate where a transistor and a light-emitting element are formed. In the dual emission structure, light is extracted through both the top surface and the bottom surface. For example, the second electrode layer 4031 is transparent in the case of the top emission structure. The first electrode layer 4030 is transparent in the case of the bottom emission structure. The first and second electrode layers 4030 and 4031 are transparent in the case of the dual emission structure.

FIG. 19A is a cross-sectional view in which top-gate transistors are provided as the transistors 4011 and 4010 in FIG. 18A. Similarly, FIG. 19B is a cross-sectional view in which top-gate transistors are provided as the transistors 4011 and 4010 in FIG. 18B.

In each of the transistors 4010 and 4011 in each of FIGS. 19A and 19B, the electrode 517 functions as a gate electrode, the electrode 510 functions as one of a source electrode and a drain electrode, and the electrode 511 functions as the other of the source electrode and the drain electrode.

The description of FIGS. 18A and 18B can be referred to for the detail of other components in FIGS. 19A and 19B.

FIG. 20A is a cross-sectional view in which the transistors 4010 and 4011 in FIG. 19A each include an electrode 516 functioning as a back gate. Similarly, FIG. 20B is a cross-sectional view in which the transistors 4010 and 4011 in FIG. 19B each include the electrode 516 functioning as a back gate.

The transistors 4010 and 4011 each include a top gate and a back gate, so that the on-state current of the transistors can be increased. In addition, the threshold voltage of the transistors can be controlled.

The description of FIGS. 18A and 18B can be referred to for the detail of other components in FIGS. 20A and 20B.

Embodiment 7

An application example of a display module including the display panel described in the above embodiments is described with reference to FIG. 21.

Figure 21:
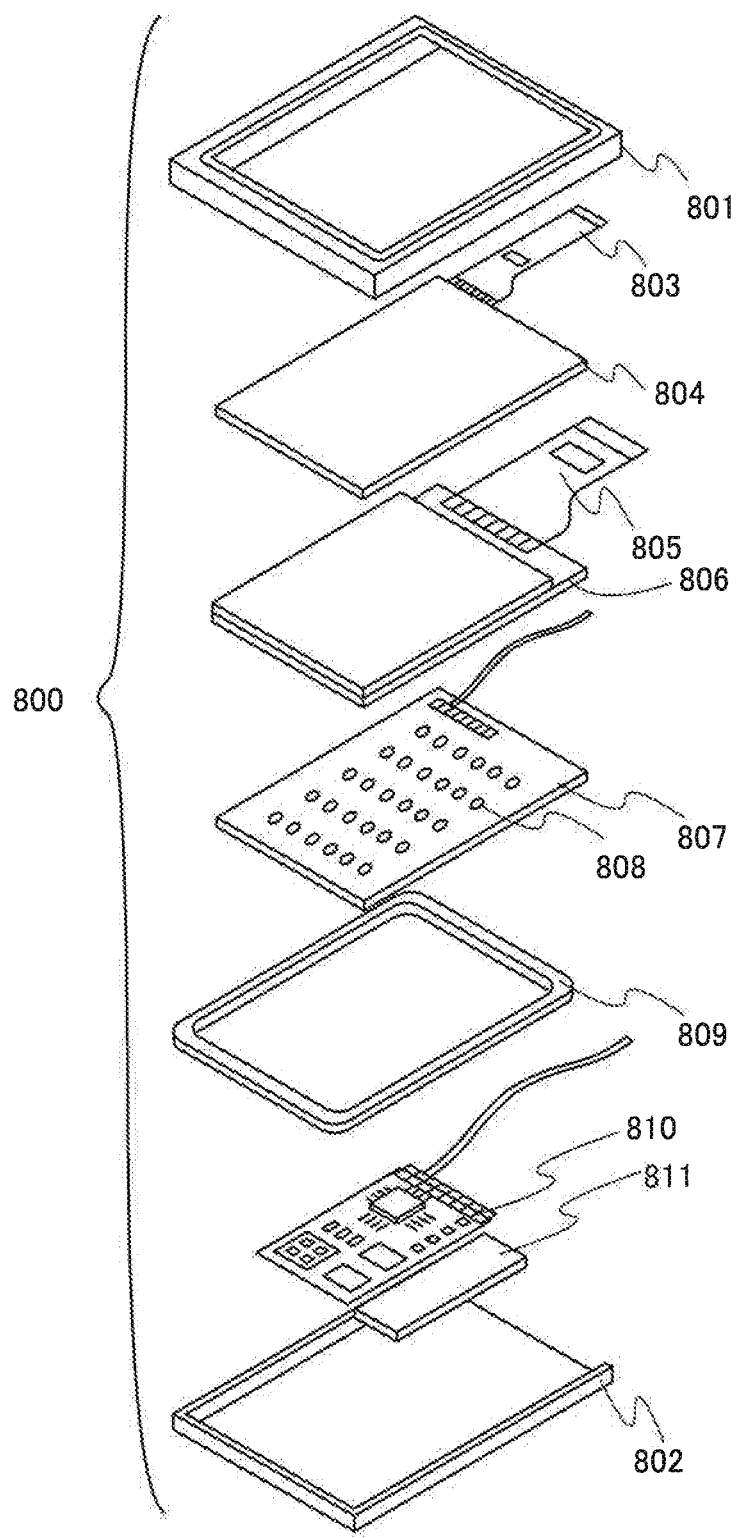
FIG. 21 illustrates an example of a display module.

In a display module 800 illustrated in FIG. 21, a touch panel 804 connected to an FPC 803, a display panel 806 connected to an FPC 805, a backlight unit 807, a frame 809, a printed circuit board 810, and a battery 811 are provided between an upper cover 801 and a lower cover 802. Note that the backlight unit 807, the battery 811, the touch panel 804, and the like are not provided in some cases.

The display panel described in the above embodiments can be used as the display panel 806 in FIG. 21.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can be formed to overlap with the display panel 806. It is also possible to provide a touch panel function for a counter substrate (sealing substrate) of the display panel 806. Alternatively, a photosensor may be provided in each pixel of the display panel 806 so that an optical touch panel is obtained. Further alternatively, an electrode for a touch sensor may be provided in each pixel of the display panel 806 so that a capacitive touch panel is obtained. In such cases, the touch panel 804 can be omitted.

Figure 22A:
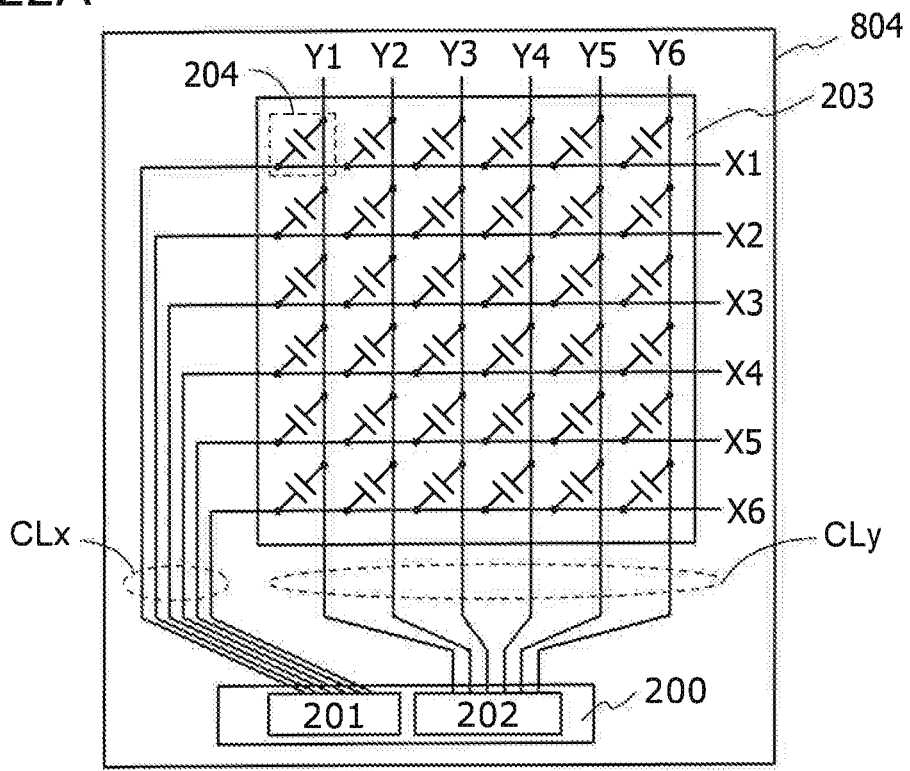
FIGS. 22A and 22B each schematically illustrate a structure example of a touch panel.

FIG. 22A is a schematic diagram illustrating a structure example where the touch panel 804 is a mutual capacitive touch sensor. In FIG. 22A, as an example, six wirings X1 to X6 represent wirings CLx to which a pulse voltage is applied, and six wirings Y1 to Y6 represent wirings CLy which detect changes in current. The number of wirings is not limited to those illustrated in FIG. 22A. FIG. 22A also illustrates a capacitor 204 that is formed with the wiring CLx and the wiring CLy overlapping with each other or being provided close to each other.

The wirings CLx and the wirings CLy are electrically connected to an IC 200. The IC 200 includes a driver circuit 201 and a detecting circuit 202.

The driver circuit 201 is, for example, a circuit for sequentially applying a pulse voltage to the wirings X1 to X6. By applying a pulse voltage to the wirings X1 to X6, an electric field is generated between the wirings CLx and CLy of the capacitors 204. With a pulse voltage, current flows through the capacitor 204. An electric field generated between the wirings is changed by being blocked, for example, when a finger or a stylus touches the touch sensor. That is, for example, by touch with a finger or a stylus, the capacitance of the capacitor 204 is changed. By utilizing the change in capacitance caused by touch with a finger or a stylus as described above, the approach or contact of an object can be detected.

The detecting circuit 202 is a circuit for detecting changes in current flowing through the wirings Y1 to Y6 that are caused by the changes in capacitance of the capacitors 204. No change in the current values of the wirings Y1 to Y6 is detected when there is no approach or contact of an object, whereas a decrease in the current value is detected when capacitance is decreased owing to the approach or contact of an object. In order to detect a change in current, the total amount of current may be detected. In that case, an integrator circuit or the like may be used to detect the total amount of current. Alternatively, the peak value of current may be detected. In that case, current may be converted into voltage, and the peak value of voltage may be detected.

Although the driver circuit 201 and the detecting circuit 202 are formed in the same IC in FIG. 22A, the driver circuit 201 and the detecting circuit 202 may be formed in separate ICs. The detecting circuit 202 easily malfunctions due to the influence of noise, while the driver circuit 201 might be a generation source of noise. The detecting circuit 202 can be prevented from malfunctioning by being formed in an IC different from an IC in which the driver circuit 201 is formed.

The driver circuit 201, the detecting circuit 202, and a driver circuit of the display panel 806 may be formed in one IC, which results in reduction in proportion of cost of an IC in the cost of the whole display module.

Figure 22B:
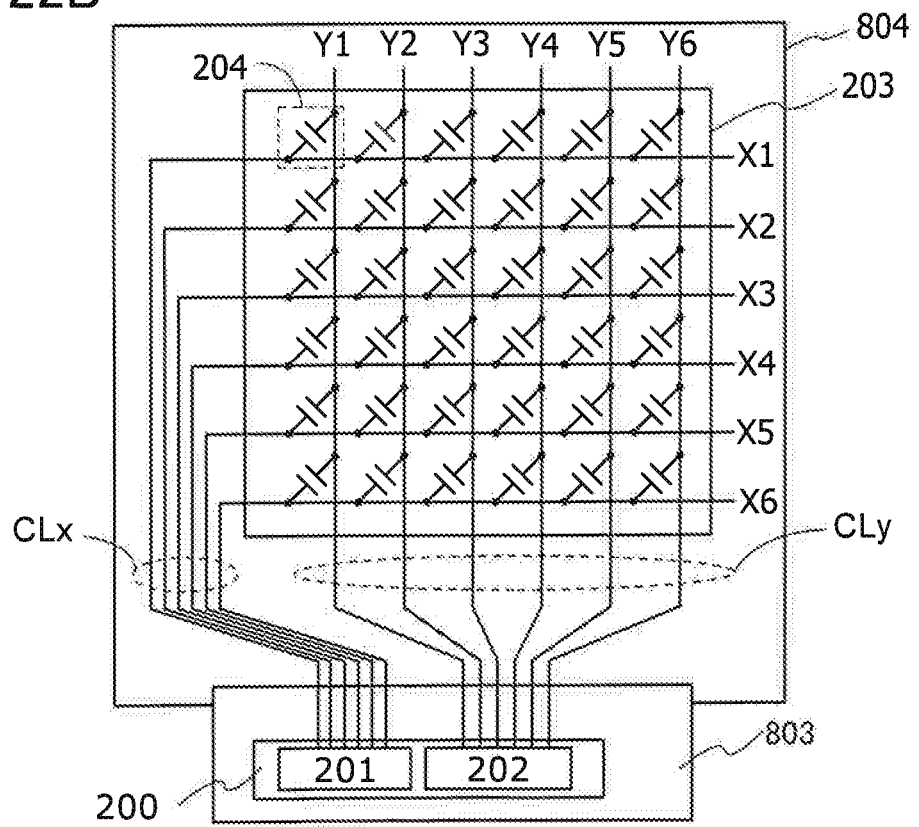

The IC 200 is provided in the touch panel 804 in FIG. 22A; however, the IC 200 may be provided in the FPC 803. FIG. 22B is a schematic view illustrating the case.

Description is continued with reference to FIG. 21.

The backlight unit 807 includes a light source 808. The light source 808 may be provided at an end portion of the backlight unit 807 and a light diffusing plate may be used.

The frame 809 protects the display panel 806 and functions as an electromagnetic shield for blocking electromagnetic waves generated by the operation of the printed circuit board 810. The frame 809 may also function as a radiator plate.

The printed circuit board 810 is provided with a power supply circuit and a signal processing circuit for outputting a video signal and a clock signal. As a power source for supplying power to the power supply circuit, an external commercial power source or a separate power source using the battery 811 may be used. The battery 811 can be omitted in the case of using a commercial power source.

The display module 800 may be additionally provided with a polarizing plate, a retardation plate, a prism sheet, or the like.

Embodiment 8

In this embodiment, an IC chip, an electronic component, electronic devices, and the like are described as examples of a semiconductor device.

<Example of Manufacturing Method of Electronic Component>

Figure 23A:
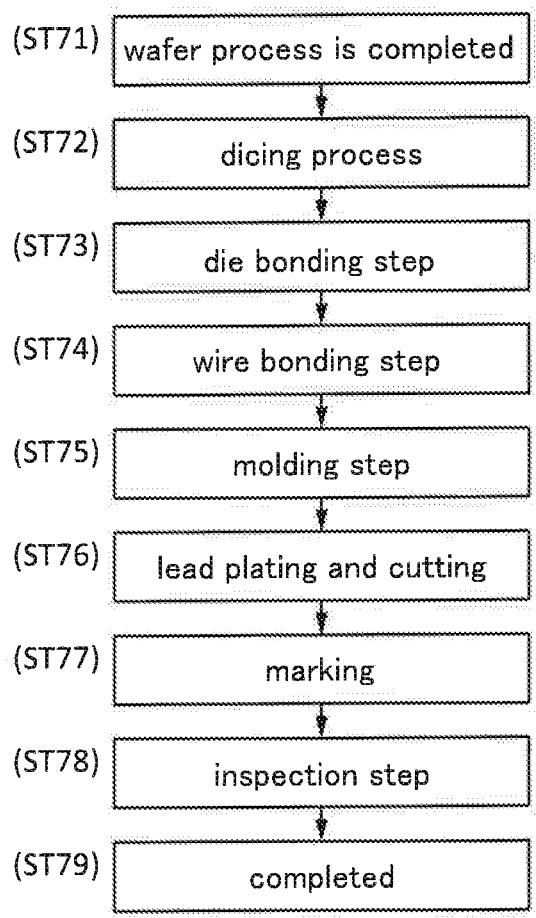
FIG. 23A is a flow chart showing an example of a manufacturing method of an electronic part.

FIG. 23A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed circuit board through an assembly process (post-process). The post-process can be finished through steps in FIG. 23A. Specifically, after an element substrate obtained in a wafer process is completed (Step ST71), a rear surface of the substrate is ground. The substrate is thinned in this step to reduce warpage or the like of the substrate in the wafer process and to reduce the size of the electronic component. Next, the substrate is divided into a plurality of chips in a dicing step (step ST72).

Figure 23B:
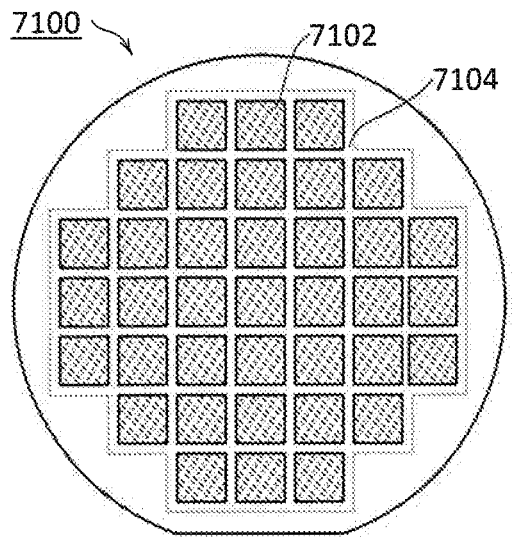
FIG. 23B is a top view of a semiconductor wafer.
Figure 23C:
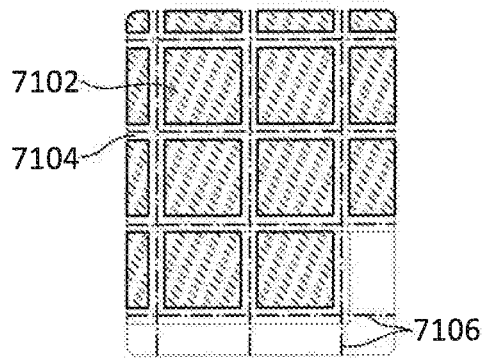
FIG. 23C is an enlarged view of a portion illustrated in FIG. 23B.

FIG. 23B is a top view illustrating a semiconductor wafer 7100 before a dicing process. FIG. 23C is an enlarged view of part of FIG. 23B. A plurality of circuit regions 7102 is provided in the semiconductor wafer 7100. A semiconductor device of one embodiment of the present invention (e.g., a memory device, an imaging device, or an MCU) is provided in the circuit region 7102.

Figure 23D:
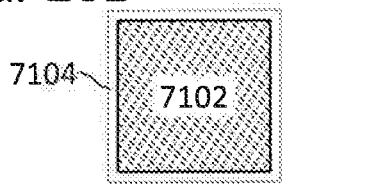
FIG. 23D is a schematic view illustrating a structure example of a chip.

The plurality of circuit regions 7102 are each surrounded by a separation region 7104. Separation lines (also referred to as "dicing lines") 7106 are set at a position overlapping with the separation regions 7104. In the step ST72, the semiconductor wafer 7100 can be cut along the separation lines 7106 into chips 7110 including the circuit regions 7102. FIG. 23D is an enlarged view of the chip 7110.

A conductive layer or a semiconductor layer may be provided in the separation regions 7104. Providing a conductive layer or a semiconductor layer in the separation regions 7104 relieves ESD that might be caused in a dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After the step ST72, the divided chips are separately picked up to be mounted on and bonded to a lead frame in a die bonding step (a step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (a step ST74). A silver line or a gold line can be used as the metal fine line. Either ball bonding or wedge bonding may be used as wire bonding.

A molding step is performed to seal the wire bonded chip with an epoxy resin or the like (a step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (a step ST76). This plating step prevents rust of the lead and facilitates soldering at the time of mounting the chip on a printed circuit board in a later step. Printing (marking) is performed on a surface of the package (a step ST77). Through an inspection step (a step ST78), the electronic component is completed (a step ST79). When the electronic component includes the semiconductor device described in the above embodiment, a low-power small electronic component can be provided.

Figure 23E:
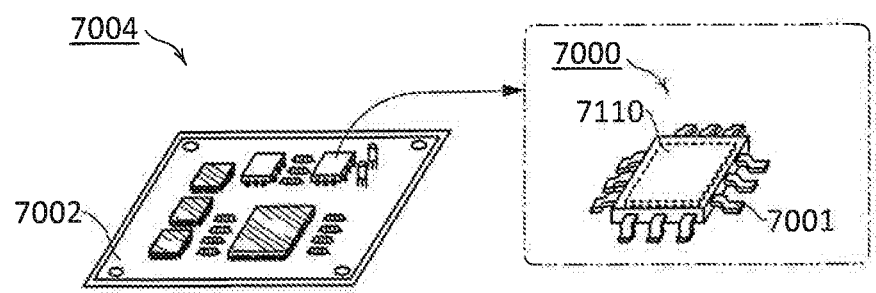
FIG. 23E is a schematic perspective view illustrating a structure example of an electronic part.

FIG. 23E is a schematic perspective view of the completed electronic component. FIG. 23E illustrates a schematic perspective view of a quad flat package (QFP) as an example of the electronic component. As illustrated in FIG. 23E, an electronic component 7000 includes a lead 7001 and a chip 7110.

The electronic component 7000 is mounted on a printed circuit board 7002, for example. When a plurality of electronic components 7000 are used in combination and electrically connected to each other over the printed circuit board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described below with reference to FIGS. 24A to 24C and FIGS. 25A to 25E. A touch panel device including a touch sensor is preferably used for a display portion of each of the electronic devices in FIG. 24A and the like. With the touch panel device, the display portion can also function as an input portion of the electronic device.

Figure 24A:
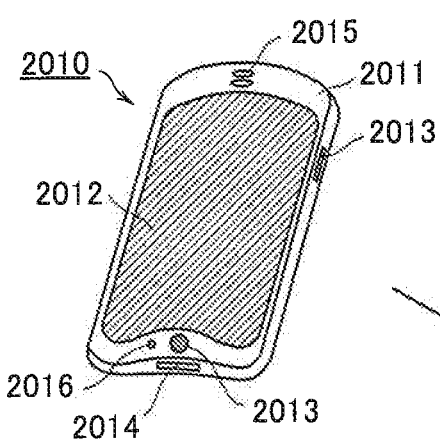
FIGS. 24A to 24C illustrate structure examples of an electronic device.

An information terminal 2010 in FIG. 24A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Power on/off operation, screen switching of the display portion 2012, and the like can be performed by pressing the operation button 2013.

Figure 24B:
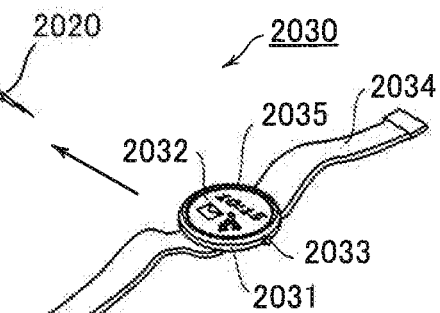

FIG. 24B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 24C:
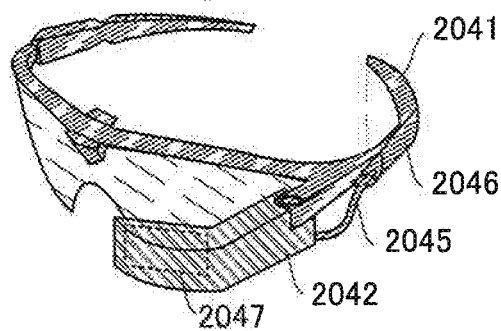

FIG. 24C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

An information terminal or the like which performs communication with a wireless signal can have a function of generating energy by any one of an electromagnetic coupling method, an electromagnetic induction method, and a radio wave method with an antenna used for the communication.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 25A:
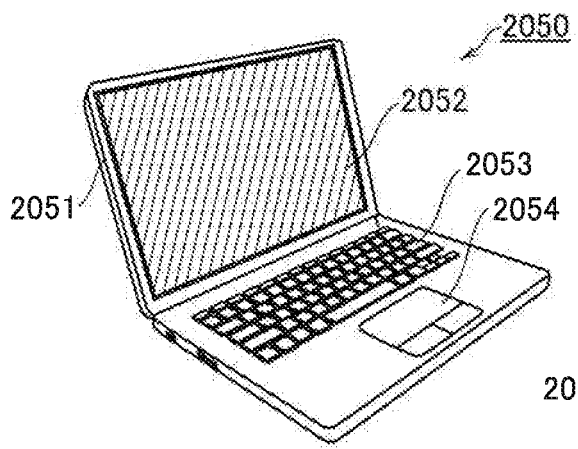
FIGS. 25A to 25E illustrate structure examples of an electronic device.

A laptop 2050 in FIG. 25A includes a housing 2051, a display portion 2052, a keyboard 2053, and a pointing device 2054. The laptop 2050 can be operated by touch operation of the display portion 2052.

Figure 25B:
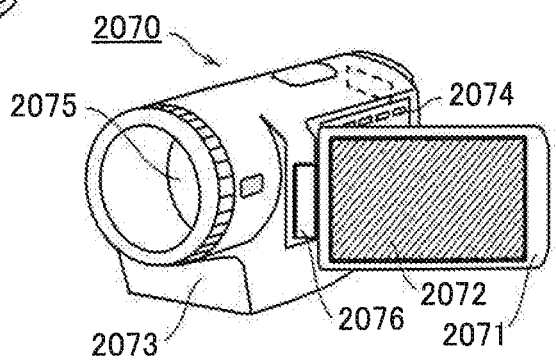

A video camera 2070 in FIG. 25B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 25C:
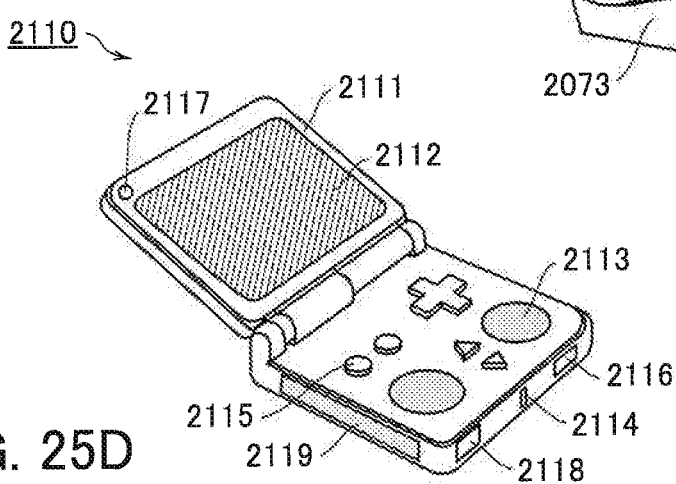

A portable game machine 2110 in FIG. 25C includes a housing 2111, a display portion 2112, speakers 2113, an LED lamp 2114, operation key buttons 2115, a connection terminal 2116, a camera 2117, a microphone 2118, and a recording medium read portion 2119.

Figure 25D:
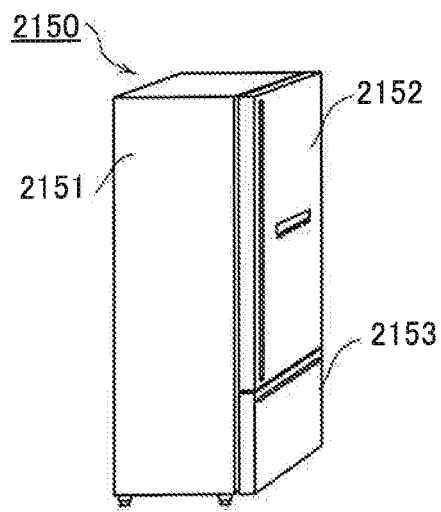

An electric refrigerator-freezer 2150 in FIG. 25D includes a housing 2151, a refrigerator door 2152, a freezer door 2153, and the like.

Figure 25E:
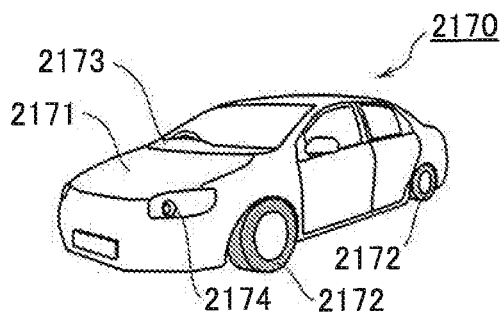

A motor vehicle 2170 in FIG. 25E includes a car body 2171, wheels 2172, a dashboard 2173, lights 2174, and the like. The processor in Embodiment 2 is used as each of processors in the motor vehicle 2170.

This application is based on Japanese Patent Application serial no. 2016-045375 filed with Japan Patent Office on Mar. 9, 2016, the entire contents of which are hereby incorporated by reference.

What is claimed is:

1. A method for driving a semiconductor device comprising a digital-analog converter circuit, an amplifier circuit, first to fourth switches, an input terminal, a first output terminal, and a second output terminal comprising:
    performing feedback control by the amplifier circuit when the first switch and the fourth switch are on and the second switch and the third switch are off; and
    performing comparison control by the amplifier circuit when the first switch and the fourth switch are off and the second switch and the third switch are on,
    wherein an output terminal of the digital-analog converter circuit is electrically connected to a non-inverting input terminal of the amplifier circuit,
    wherein one terminal of the first switch is electrically connected to an inverting input terminal of the amplifier circuit,
    wherein the other terminal of the first switch is electrically connected to an output terminal of the amplifier circuit,
    wherein one terminal of the second switch is electrically connected to the inverting input terminal of the amplifier circuit,
    wherein the other terminal of the second switch is electrically connected to the input terminal,
    wherein one terminal of the third switch is electrically connected to the output terminal of the amplifier circuit,
    wherein the other terminal of the third switch is electrically connected to the second output terminal,
    wherein one terminal of the fourth switch is electrically connected to the output terminal of the amplifier circuit,
    wherein the other terminal of the fourth switch is electrically connected to the first output terminal, and
    wherein the other terminal of the second switch is not electrically connected to the other terminal of the fourth switch.

2. The method according to claim 1, wherein the second switch and the third switch are controlled to be turned on or off by a same signal.

3. The method according to claim 1, wherein the first switch and the fourth switch are controlled to be turned on or off by a same signal.

4. The method according to claim 1, further comprising:
    detecting offset voltage by performing the comparison control; and
    performing an operation on data from a frame memory by using the offset voltage.

5. A method for driving a semiconductor device comprising a digital-analog converter circuit, an amplifier circuit, first to third switches, an input terminal, and an output terminal comprising:
    performing feedback control by the amplifier circuit when the first switch is on and the second switch and the third switch are off; and
    performing comparison control by the amplifier circuit when the first switch is off and the second switch and the third switch are on,
    wherein an output terminal of the digital-analog converter circuit is electrically connected to a non-inverting input terminal of the amplifier circuit,
    wherein one terminal of the first switch is electrically connected to an inverting input terminal of the amplifier circuit,
    wherein the other terminal of the first switch is electrically connected to an output terminal of the amplifier circuit,
    wherein one terminal of the second switch is electrically connected to the inverting input terminal of the amplifier circuit,
    wherein the other terminal of the second switch is electrically connected to the input terminal,
    wherein one terminal of the third switch is electrically connected to the output terminal of the amplifier circuit,
    wherein the other terminal of the third switch is electrically connected to the output terminal, and
    wherein the other terminal of the second switch is not electrically connected to the output terminal of the amplifier circuit.

6. The method according to claim 5, wherein the second switch and the third switch are controlled to be turned on or off by a same signal.

7. The method according to claim 5, further comprising:
    detecting offset voltage by performing the comparison control; and
    performing an operation on data from a frame memory by using the offset voltage.

8. A method for driving a semiconductor device comprising a digital-analog converter circuit, an amplifier circuit, first to fifth switches, an input terminal, a first output terminal, and a second output terminal comprising:
    performing feedback control by the amplifier circuit when the first switch and the fourth switch are on and the second switch, the third switch, and the fifth switch are off; and
    performing comparison control by the amplifier circuit when the first switch and the fourth switch are off and the second switch, the third switch, and the fifth switch are on,
    wherein an output terminal of the digital-analog converter circuit is electrically connected to a non-inverting input terminal of the amplifier circuit,
    wherein one terminal of the first switch is electrically connected to an inverting input terminal of the amplifier circuit,
    wherein the other terminal of the first switch is electrically connected to an output terminal of the amplifier circuit,
    wherein one terminal of the second switch is electrically connected to the inverting input terminal of the amplifier circuit,
    wherein the other terminal of the second switch is electrically connected to the input terminal,
    wherein one terminal of the third switch is electrically connected to the output terminal of the amplifier circuit,
    wherein the other terminal of the third switch is electrically connected to the second output terminal,
    wherein one terminal of the fourth switch is electrically connected to the output terminal of the amplifier circuit,
    wherein the other terminal of the fourth switch is electrically connected to one terminal of the fifth switch and the first output terminal, and
    wherein the other terminal of the second switch is not electrically connected to the other terminal of the fourth switch.

9. The method according to claim 8, wherein the second switch, the third switch, and the fifth switch are controlled to be turned on or off by a same signal.

10. The method according to claim 8, wherein the first switch and the fourth switch are controlled to be turned on or off by a same signal.

11. The method according to claim 8, further comprising:
detecting offset voltage by performing the comparison control; and
performing an operation on data from a frame memory by using the offset voltage.

* * * * *